(12) United States Patent
Hamamatsu et al.

(10) Patent No.: US 6,646,936 B2
(45) Date of Patent: Nov. 11, 2003

(54) SEMICONDUCTOR MEMORY DEVICE SHIFTABLE TO TEST MODE IN MODULE AS WELL AS SEMICONDUCTOR MEMORY MODULE USING THE SAME

(75) Inventors: Akihito Hamamatsu, Hyogo (JP); Shinji Tanaka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/094,645

(22) Filed: Mar. 12, 2002

(65) Prior Publication Data
US 2003/0035328 A1 Feb. 20, 2003

(30) Foreign Application Priority Data
Aug. 8, 2001 (JP) ........................ 2001-240686

(51) Int. Cl.[7] ................................................. G11C 7/00
(52) U.S. Cl. ...................................................... 365/201
(58) Field of Search ............................ 365/201, 189.09, 365/189.05, 189.11, 230.08, 233, 241, 225.7

(56) References Cited

U.S. PATENT DOCUMENTS

| 5,383,156 A | * | 1/1995 | Komatsu ..................... 365/200 |
| 5,917,765 A | * | 6/1999 | Morishita et al. ........... 365/201 |
| 2001/0054164 A1 | * | 12/2001 | Tanizaki et al. ............ 714/718 |

* cited by examiner

Primary Examiner—Thong Le
(74) Attorney, Agent, or Firm—McDermott, Will & Emery

(57) ABSTRACT

A DRAM includes a test mode circuit. Test mode circuit generates respective test mode signals of an L level and an H level by detecting first and second power supply voltages in response to first and second test mode shift signals, respectively. A control circuit controls peripheral circuits to input and output data for executing a special test to and from a plurality of memory cells in response to receiving of the test mode signals of an L level and an H level. Consequently, a semiconductor memory device can enter the test mode in a module.

20 Claims, 31 Drawing Sheets

SEMICONDUCTOR MEMORY DEVICE SHIFTABLE TO TEST MODE IN MODULE AS WELL AS SEMICONDUCTOR MEMORY MODULE USING THE SAME

BACKGROUND OF THE INVENTION

1. Field of the Invention

The present invention relates to a semiconductor memory device and a semiconductor module including a plurality of such semiconductor memory devices, and particularly relates to the semiconductor memory device, which can enter a test mode in the module, as well as the semiconductor module.

2. Description of the Background Art

In recent years, attention has been given to a DIMM (Double Inline Memory Module), which operates in synchronization with a clock signal having a frequency of 50 MHz or more. The DIMM has two semiconductor modules formed on the opposite sides of one substrate, respectively. The semiconductor module includes a plurality of DRAMs (Dynamic Random Access Memories).

In particular, the semiconductor module used in a registered DIMM (RDIMM) includes a plurality of DRAMs, and is configured to perform input/output of data to and from the DRAMs in synchronization with a clock signal having a high frequency of 50 MHz or more.

Referring to FIG. 33, a semiconductor module 620 used in an RDIMM includes DRAMs 631–639, registered buffers 650 and 660, and a PLL circuit 670. Semiconductor module 630 used in the RDIMM includes DRAMs 640–648.

PLL circuit 670 generates a clock signal having a high frequency of 50 MHz or more and adjusts timing, according to which input signals are applied to DRAMs 631–648.

Referring to FIG. 34, each of registered buffer circuits 650 and 660 receives the control signal, and address signal, which are externally applied, and coverts the voltage levels forming the control signals to the voltage levels to be used in corresponding semiconductor module 620 or 630 for applying them to DRAMs 631–648. Registered buffer 650 applies the input signal to DRAMs 631–639 of semiconductor module 620, and registered buffer 660 applies the input signal to DRAMs 640–648 of semiconductor module 630.

Each of DRAMs 631–648 includes a test mode circuit 700 shown in FIG. 35. Referring to FIG. 35, test mode circuit 700 includes P-channel MOS transistors 701 and 703, N-channel MOS transistors 702, 704 and 705, an inverter 711 and an AND gate 712.

P- and N-channel MOS transistors 701 and 702 are connected in series between a power supply node 706 and a node 710. P- and N-channel MOS transistors 703 and 704 are connected in series between power supply node 706 and node 710. P- and N-channel MOS transistors 703 and 704 are connected in parallel to P- and N-channel MOS transistors 701 and 702.

P-channel MOS transistors 701 and 703 receive a voltage on power supply node 706 as a substrate voltage. A voltage on a node 708 is supplied to gate terminals of P-channel MOS transistors 701 and 703. N-channel MOS transistor 702 receives a signal SVIH on its gate terminal, and N-channel MOS transistor 704 receives a reference voltage VDD on its gate terminal. Signal SVIH is formed of a high potential, which is input via a control pin such as an address pin in a test mode. N-channel MOS transistor 705 is connected between node 710 and a ground node 707, and receives a control signal CSC on its gate terminal.

A differential circuit formed of P-channel MOS transistors 701 and 703 as well as N-channel MOS transistors 702, 704 and 75 is a differential comparing circuit of a current mirror type, which becomes active in response to control signal CSC of H (logical high) level, and compares the voltage level of signal SVIH with the voltage level of reference voltage VDD for outputting a result of the comparison from a node 709. When the voltage level of signal SVIH is higher than the voltage level of reference voltage VDD, the voltage on node 709 is lower than the voltage on node 708, and the differential circuit outputs a signal of L (logical low) level to inverter 711. When the voltage level of signal SVIH is lower than the voltage level of reference voltage VDD, the voltage on node 709 is higher than the voltage on node 708 so that a signal of H level is output to inverter 711.

Inverter 711 inverts the logical level of the signal sent from node 709, and sends it to AND gate 712. AND gate 712 performs a logical AND on output signal of inverter 711 and control signals CSA and CSB.

For shifting DRAMs 631–648 to the test mode, test mode circuit 700 receives control signals CSA, CSB and CSC of H level, and also receives signal SVIH formed of a voltage level higher than the voltage level in a normal operating range. Thereby, N-channel MOS transistor 705 is turned on, and the differential circuit formed of P-channel MOS transistors 701 and 703 as well as N-channel MOS transistors 702 and 704 compares the voltage level of signal SVIH with the voltage level of reference voltage VDD, and sends the signal of L level from node 709 to inverter 711. Inverter 711 inverts this signal of L level, and outputs the signal of H level to AND gate 712. AND gate 712 performs a logical AND on the signal of H level sent from inverter 711 as well as control signals CSA and CSB of H level, and generates test mode signal TM of H level.

In this manner, each of DRAMs 631–648 is shifted to the test mode when used alone, and is subjected to various operation tests.

In the RDIMM provided with the DRAMs, however, the voltage level of the externally supplied signal is converted to the voltage level for use in the RDIMM before being output to the DRAM, as already described. Therefore, in the semiconductor module such as an RDIMM, a signal (SVIH) formed of a high voltage level shifting the DRAM to the test mode cannot be applied to the DRAMs. Consequently, the semiconductor module suffers from such a problem that the DRAM in the module cannot be shifted to the test mode.

SUMMARY OF THE INVENTION

Accordingly, an object of the invention is to provide a semiconductor memory device, which can be shifted to a test mode in a module.

Another object of the invention is to provide a semiconductor module, in which a semiconductor memory device can be shifted to a test mode.

A semiconductor memory device according to the invention includes a power supply terminal for receiving a power supply voltage; a memory cell array including a plurality of memory cells; a peripheral circuit for inputting and outputting data to and from the plurality of memory cells; and a test mode circuit for operating, in an operation of shifting to a test mode, to detect a voltage level of a power supply voltage supplied from the power supply terminal in response to external input of a test mode shift signal, and generate a test mode signal for testing a special operation when the detected voltage level is different from the voltage level in a normal operation. The peripheral circuit performs input and output of data used for testing the special operation of each of the plurality of memory cells in response to the test mode signal.

For shifting the semiconductor memory device of this invention to the test mode, the device is supplied with the power supply voltage having a voltage level different from the voltage level used in the normal operation. When the power supply voltage thus supplied is detected, the semiconductor memory device can be shifted to the test mode. According to the invention, therefore, the semiconductor memory device can be shifted to the test mode by receiving the power supply voltage with the voltage level different from the voltage level in the normal operation. Consequently, it is possible to shift the semiconductor memory device to the test mode in the semiconductor module provided with the buffer circuit, which converts the externally supplied signal to the signal formed of the voltage level used in the module.

Preferably, the test mode shift signal is formed of first and second test mode shift signals, the power supply voltage is formed of first and second power supply voltages, the test mode circuit detects the voltage level of the first power supply voltage in response to the first test mode shift signal, detects the voltage level of the second power supply voltage in response to the second test mode shift signal, and generates the test mode signal when the detected voltage level of the second power supply voltage is different from the detected voltage level of the first power supply voltage.

For shifting to the test mode, the two power supply voltages with different voltage levels are supplied to the semiconductor memory device. When the voltage level of one of the supplied power supply voltages is different from the voltage level of the other power supply voltage, the semiconductor memory device enters the test mode. According to the invention, therefore, it is possible to shift the semiconductor memory device to the test mode by supplying the two power supply voltages of different voltage levels. As a result, the semiconductor memory device can be shifted to the test mode in the semiconductor module provided with the buffer circuit, which converts the externally supplied signal to the signal formed of the voltage level used in the module, and applies it to the semiconductor memory device.

Preferably, the test mode circuit generates the test mode signal when the detected voltage level of the second power supply voltage is higher than the detected voltage level of the first power supply voltage.

For shifting to the test mode, the two power supply voltages of different voltage levels are supplied to the semiconductor memory device. When the voltage level of one of the supplied power supply voltages is higher than the voltage level of the other power supply voltage, the semiconductor memory device is shifted to the test mode. In this invention, therefore, the semiconductor memory device can be shifted to the test mode by supplying successively the power supply voltage having a predetermined voltage level and the power supply voltage having a voltage level higher than the predetermined voltage level. As a result, the semiconductor memory device can be shifted to the test mode in the semiconductor module provided with the buffer circuit, which converts an externally supplied signal to the signal formed of the voltage level used in the module, and applies it to the semiconductor memory device.

Preferably, the first power supply voltage is a power supply voltage supplied in the normal operation.

For shifting to the test mode, the first power supply voltage used in the normal operation mode and the second power supply voltage higher in voltage level than the power supply voltage in the normal operation are supplied to the semiconductor memory device. When the first and second power supply voltages are detected, the semiconductor memory device enters the test mode. According to this embodiment, therefore, the semiconductor memory device can enter the test mode without a malfunction.

Preferably, the test mode circuit includes a level detecting circuit for detecting the voltage level of the first or second power supply voltage, and outputting a first level signal indicative of the detected voltage level of the first power supply voltage and a second level signal indicative of the detected voltage level of the second power supply voltage; and a signal generating circuit for generating a first detection signal based on the first level signal and the first test mode shift signal, generating, based on the second level signal and the second test mode shift signal, a second detection signal indicating that the detected voltage level of the second power supply voltage is higher than the detected voltage level of the first power supply voltage, and outputting the generated first and second detection signals as the test mode signals.

The two level signals indicating the voltage levels of the two power supply voltages are generated, and the detection signal for the power supply voltage with the lower voltage level and the detection signal for the power supply voltage with the higher voltage level are generated based on the two level signals and the two test mode shift signals. Thereby, the semiconductor memory device is shifted to the test mode. According to the invention, therefore, the semiconductor memory device can accurately enter the test mode based on the voltage levels of the detected two power supply voltages.

Preferably, the level detecting circuit is formed of a voltage dividing circuit for dividing the first or second power supply voltage to generate a first or second divided voltage, and a comparing circuit for comparing the voltage level of the first or second divided voltage with a reference voltage level to output the first or second level signal.

By comparing the divided voltage of the power supply voltage with the reference voltage, the voltage level of the power supply voltage is detected. According to the invention, therefore, the voltage levels of the two power supply voltages, which are different from each other, can be accurately detected. Consequently, the semiconductor memory device can accurately enter the test mode.

Preferably, the level detecting circuit is formed of a voltage dividing circuit for dividing the first or second power supply voltage to generate a first or second divided voltage, and a comparing circuit for comparing the voltage level of the first or second divided voltage with a first reference voltage level to output a first comparison result signal, comparing the voltage level of the first or second divided voltage with a second reference voltage level higher than the first reference voltage level to generate a second comparison result signal, and outputting the first or second level signal based on the generated first and second comparison result signals.

The two divided voltages with the different voltage levels produced by dividing the power supply voltages are compared with the two reference voltages with the different voltage levels, whereby the different voltage levels of the two power supply voltages are detected. According to the invention, therefore, it is possible to prevent erroneous shifting to the test mode due to variations in voltage levels during rising of the power supply voltage.

Preferably, the voltage dividing circuit is activated only in an operation of shifting to the test mode.

Only when the semiconductor memory device is to be shifted to the test mode, the power supply voltage is divided, and the voltage level of the power supply voltage is detected. According to the invention, therefore, the power consumption of the semiconductor memory device can be reduced.

Preferably, the test mode circuit further includes an activating circuit for selectively activating and deactivating the signal generating circuit in response to a type of a semiconductor module equipped with the semiconductor memory device.

The test mode circuit is activated and deactivated by the semiconductor module equipped with the semiconductor memory device. According to the invention, therefore, it is possible to select the circuit or unit for shifting the semiconductor memory device to the test mode in response to the type of the semiconductor module.

Preferably, the activating circuit is formed of a power supply node, an output node, a resistance element connected between the power supply node and the output node, and a fuse connected between the output node and the ground node.

By blowing or not blowing off the fuse, the signal generating circuit is activated or deactivated. According to the invention, therefore, the semiconductor module for mounting the semiconductor memory device therein can be determined after the production of the semiconductor memory device, and the semiconductor memory device can enter the test mode in the semiconductor module thus determined.

Preferably, the first power supply voltage is lower in voltage level than a standard power supply voltage supplied in the normal operation, and the second power supply voltage is higher in voltage level than the standard power supply voltage.

For shifting to the test mode, the two power supply voltages having the voltage levels different from the voltage level in the normal operation are supplied to the semiconductor memory device, and the semiconductor memory device enters the test mode when the two power supply voltages are detected. According to the invention, therefore, the semiconductor memory device can accurately enter the test mode.

Preferably, the test mode circuit generates the test mode signal when the detected voltage level of the second power supply voltage is lower than the detected voltage level of the first power supply voltage.

For shifting to the test mode, the two power supply voltages with different voltage levels are supplied to the semiconductor memory device, and the semiconductor memory device enters the test mode when the power supply voltages with the higher and lower voltage levels are successively detected. According to the invention, therefore, the semiconductor memory device, which is supplied with the power supply voltage with the high voltage level in the normal operation, can accurately enter the test mode.

Preferably, the second power supply voltage is a power supply voltage supplied in the normal operation.

For shifting to the test mode, the semiconductor memory device is successively supplied with the power supply voltage having the voltage level higher than the voltage level in the normal operation and the power supply voltage having the voltage level in the normal operation. When the two power supply voltages are detected, the semiconductor memory device enters the test mode. According to the invention, therefore, the semiconductor memory device can be shifted to the test mode by supplying the power supply voltage having the voltage level higher than the voltage level in the normal operation. Consequently, the semiconductor memory device can accurately enter the test mode.

Preferably, the power supply terminal is formed of a first power supply terminal for receiving a first power supply voltage used in the normal operation, and a second power supply terminal for receiving a second power supply voltage. The test mode circuit generates the test mode signal when detecting in accordance with the input of the test mode shift signal that the voltage level of the second power supply voltage is higher than the voltage level of the first power supply voltage.

For shifting to the test mode, the first and second power supply voltages with the different voltage levels are simultaneously supplied to the semiconductor memory device. When the voltage level of the second power supply voltage is higher than the voltage level of the first power supply voltage, the semiconductor memory device enters the test mode. According to the invention, therefore, the semiconductor memory device can accurately enter the test mode by using the power supply voltages having the voltage levels different from the voltage level in the normal operation.

Preferably, the test mode circuit includes a comparing circuit for comparing a voltage level of a divided voltage produced by dividing the second power supply voltage with the voltage level of the first power supply voltage, and outputting a comparison result and a signal generating circuit for generating the test mode signal in response to the test mode shift signal when the comparison result indicates that the voltage level of the divided voltage is higher than the voltage level of the first power supply voltage.

For shifting to the test mode, the supplied power supply voltage is divided for detecting the voltage level of the supplied power supply voltage. When the detected voltage level is higher than the voltage level in the normal operation, the semiconductor memory device is shifted to the test mode. According to the invention, therefore, it is possible to detect accurately the voltage level of the power supply voltage supplied at the time of shifting to the test mode. As a result, the semiconductor memory device can be accurately shifted the test mode.

A semiconductor memory device according to the invention includes a power supply terminal for receiving a power supply voltage; a memory cell array including a plurality of memory cells; a peripheral circuit for inputting and outputting data to and from each of the plurality of memory cells; and a test mode circuit for operating, in an operation of shifting to a test mode, to produce a plurality of logic signals based on the power supply voltage, and to output the plurality of produced logic signals as test signals indicating contents of the test for the memory cell. The peripheral circuit performs input and output of data used for executing the test in response to a logical pattern of the plurality of logic signals.

In the semiconductor memory device according to the invention, the plurality of logic signals are produced based on the supplied power supply voltage when the device is to be shifted to the test mode. Tests of different contents are performed in response to the combination of the logical levels of the plurality of produced logic signals. According to the invention, therefore, various operation tests can be performed in the semiconductor memory device without particularly employing a circuit for indicating the test contents.

Preferably, the test mode circuit includes a level detecting circuit for dividing the power supply voltage to a plurality of divided voltages having different voltage levels, respectively, and comparing the plurality of divided voltages with a reference voltage level to generate a plurality of level signals indicating the voltage levels of the plurality of divided voltages; and a signal generating circuit for generating the plurality of logic signals based on an externally applied test mode shift signal and the plurality of level signals.

The plurality of divided voltages with different voltage levels are produced from the one power supply voltage, and the plurality of logic signals, which have the logical levels corresponding to the voltage levels of the plurality of divided voltages, are generated. According to the invention, therefore, tests of different contents can be performed by changing the voltage level of the power supply voltage supplied to the semiconductor memory device in an operation of shifting to the test mode.

Preferably, the level detecting circuit includes a voltage dividing circuit for dividing the power supply voltage to the plurality of divided voltages, and a comparing circuit for comparing the plurality of divided voltages with the reference voltage level to generate the plurality of level signals.

The plurality of divided voltages with the different voltage levels are produced from the one power supply voltage. The respective voltage levels of the plurality of divided voltages are compared with the reference voltage level, and the plurality of level signals indicating the respective voltage levels of the plurality of divided voltages are generated. According to the invention, therefore, the voltage levels of the plurality of divided voltages produced from the one power supply voltage can be accurately detected. As a result, the plurality of logic signals with the different logical levels can be accurately generated.

A semiconductor module according to the invention includes a PLL circuit for generating a clock signal formed of a predetermined frequency; a registered buffer circuit for converting an externally supplied input signal to an input signal formed of a voltage level for internal use, and outputting the converted input signal in synchronization with the clock signal; a power supply terminal for receiving a power supply voltage; and a plurality of semiconductor memory devices for receiving the input signal from the registered buffer circuit and operating in synchronization with the clock signal. Each of the plurality of semiconductor memory devices includes a memory cell array including a plurality of memory cells, a peripheral circuit inputting/outputting data to and from each of the plurality of memory cells, and a test mode circuit detects the voltage level of the power supply voltage supplied from the power supply terminal in response to input of a test mode shift signal from the registered buffer circuit, and generating a test mode signal for testing a special operation based on the test mode shift signal. The peripheral circuit performs input/output of data used for testing the special operation to and from each of the plurality of memory cells in response to the test mode signal.

For shifting the semiconductor memory device to the test mode in the semiconductor module according to the invention, the voltage level of the externally supplied power supply voltage is detected, and thereby the semiconductor memory device is shifted to the test mode. According to the invention, therefore, the semiconductor memory device can be shifted to the test mode in the module.

Preferably, the test mode circuit produces a plurality of logic signals having logical levels corresponding to the detected voltage level, and outputs the plurality of produced logic signals as test signals indicating contents of the test of the memory cells. The peripheral circuit performs input and output of data used for executing the test in response to a logical pattern of the plurality of logic signals.

When shifted to the test mode, the plurality of logic signals are produced based on the power supply voltage supplied to the device, and contents of the test are determined in response to the combination of the logical levels of the plurality of logic signals. According to the invention, therefore, various operation tests of the semiconductor memory device can be performed in the module without particularly employing a circuit for designating the test contents.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. In the figures, the same or corresponding portions bear the same reference numbers, and description thereof is not repeated.

[First Embodiment]

Figure 1:
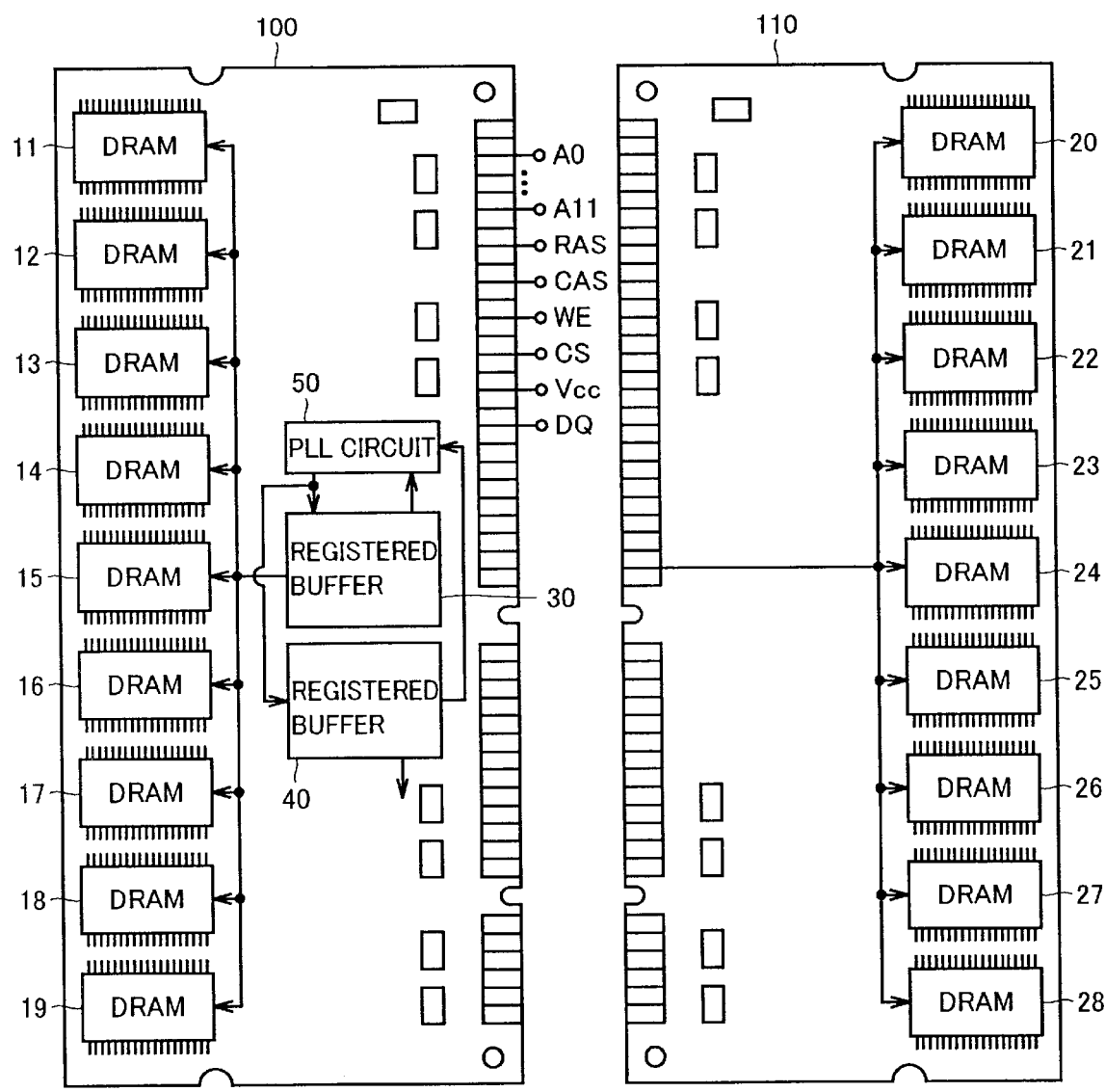
FIG. 1 is a schematic block diagram of a semiconductor module according to a first embodiment of the invention.

Referring to FIG. 1, description will now be given on a semiconductor module used as a module such as an RDIMM. A semiconductor module 100 of a first embodiment includes DRAMs 11–19, registered buffers 30 and 40, and a PLL circuit 50. A semiconductor module 110 includes DRAMs 20–28.

Each of DRAMs 11–28 includes a plurality of memory cells, and can store data. Registered buffers 30 and 40 receive address signals A0–A11, a row address strobe signal RAS, a column address strobe signal CAS, a write enable signal WE and a chip select signal CS through external terminals, and can convert the voltage levels forming the address signals A0–A11 and others to predetermined voltage levels to be used in semiconductor modules 100 and 110. Registered buffers 30 and 40 output address signals A0–A11 and others with the predetermined voltage levels thus converted to DRAMs 11–28 in synchronization with a clock signal CLK sent from PLL circuit 50. Row address strobe signal RAS, column address strobe signal CAS, write enable signal WE and chip select signal CS are collectively referred to as "signals MRS". Registered buffer 30 outputs address signals A0–A11 and others with the converted voltage levels to DRAMs 11–19, and registered buffer 40 outputs address signals A0–A11 and others with the converted voltage levels to DRAMs 20–28 in semiconductor module 110.

The write data is directly input from an I/O terminal DQ to DRAMs 11–28, and the read data is directly output from DRAMs 11–28 to I/O terminal DQ.

PLL circuit 50 generates clock signal CLK having a frequency of 50 MHz or more, and matches the phase of generated clock signal CLK to the phase of data, which is input from registered buffers 30 and 40. PLL circuit 50 outputs clock signal CLK having the adjusted phase to DRAMs 11–28 and registered buffers 30 and 40. Semiconductor modules 100 and 110 are supplied from an external terminal Vcc with a power supply voltage Vcc1 with the voltage level used in the normal operation or a power supply voltage Vcc2 formed of a voltage level higher than the voltage level in the normal operation.

In FIG. 1, output lines for outputting clock signal CLK from PLL circuit 50 to DRAMs 11–28 as well as output lines for outputting the read data from DRAMs 11–28 to terminal DQ of semiconductor module 100 are not shown for simplicity reasons.

Figure 2:
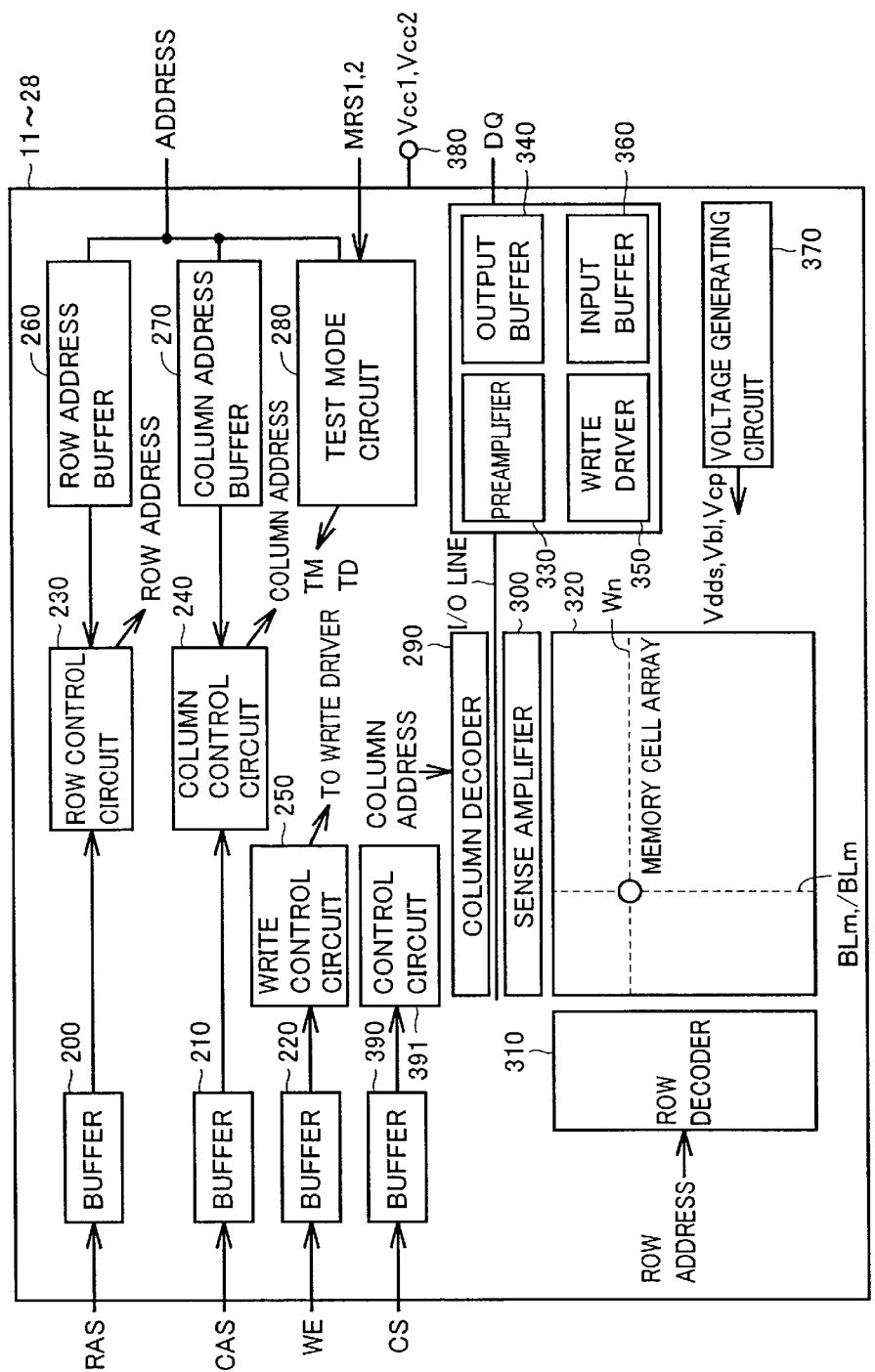
FIG. 2 is a schematic block diagram of a DRAM shown in FIG. 1.

Referring to FIG. 2, each of DRAMs 11–28 has buffers 200, 210, 220 and 390, a row control circuit 230, a column control circuit 240, a write control circuit 250, a row address buffer 260, a column address buffer 270, a test mode circuit 280, a column decoder 290, a sense amplifier 300, a row decoder 310, a memory cell array 320, a preamplifier 330, an output buffer 340, a write driver 350, an input buffer 360, a voltage generating circuit 370, a power supply terminal 380 and a control circuit 391.

Buffer 200 latches row address strobe signal RAS sent from registered buffer 30 or 40, and outputs latched row address strobe signal RAS to row control circuit 230. Buffer 210 latches column address strobe signal CAS sent from registered buffer 30 or 40, and outputs latched column address strobe signal CAS to column control circuit 240. Buffer 220 latches write enable signal WE sent from registered buffer 30 or 40, and outputs latched write enable signal WE to write control circuit 250.

Row address buffer 260 latches the address signals A0–A11 sent from registered buffer 30 or 40, and outputs latched address signals A0–A11 to row control circuit 230.

Column address buffer 270 latches address signals A0–A11 sent from registered buffer 30 or 40, and outputs latched address signals A0–A11 to column control circuit 240.

Row control circuit 230 outputs address signals A0–A11, which are sent from row address buffer 260, as the row address to row decoder 310 in accordance with the timing of switching from H level to L level of row address strobe signal RAS sent from buffer 200. Column control circuit 240 outputs address signals A0–A11, which are sent from column address buffer 270, as the column address to column decoder 290 in accordance with the timing of switching from H level to L level of column address strobe signal CAS sent from buffer 210. When write control circuit 250 receives write enable signal WE of L level from buffer 220, write control circuit 250 controls write driver 350 to write the write data to the I/O line.

Test mode circuit 280 generates a test mode signal TM and a test content designating signal TD based on signals MRS1 and MRS2 sent from registered buffer 30 or 40 as well as power supply voltages Vcc1 and Vccs supplied from power supply terminal 380.

Column decoder 290 decodes the column address sent from column control circuit 240, and activates bit line pair BLm and /BLm (m: natural number) designated by the column address thus decoded. Sense amplifier 300 transfers the write data, which is written to the I/O line by write driver 350, to activated bit line pair BLm and /BLm. Sense amplifier 300 receives the read data, which is read from the activated memory cell, via bit line pair BLm and /BLm, and amplifies the received read data. Sense amplifier 300 outputs the amplified read data to preamplifier 330 via the I/O line.

Row decoder 310 decodes the row address sent from row control circuit 230, and activates a word line Wn (n: natural number) designated by the row address thus decoded. Memory cell array 320 includes the plurality of memory cells, the plurality of bit line pairs BLm and /BLm, a plurality of equalize circuits and the plurality of word lines Wn. The plurality of memory cells are arranged in n rows and m columns, and are selectively activated by the plurality of word lines Wn and the plurality of bit line pairs BLm and /BLm. The plurality of equalize circuits are arranged for the plurality of bit line pairs BLm and /BLm, and equalize the corresponding bit line pair BLm and /BLm to a precharge voltage Vb1 before start of the input/output of data to and from the memory cells, respectively.

Preamplifier 330 amplifies the read data, which is input via the I/O line, and outputs the read data thus amplified to output buffer 340. Output buffer 340 latches the read data sent from preamplifier 330, and outputs the read data thus latched to semiconductor modules 100 and 110 via the I/O terminal DQ.

Input buffer 360 latches the write data sent from I/O terminal DQ of semiconductor module 100, and outputs the write data thus latched to write driver 350. Write driver 350 writes the write data, which is sent from input buffer 360, to the I/O line under control by write control circuit 250.

Voltage generating circuit 370 lowers the level of the power supply voltage supplied from power supply terminal 380, and generates an array operation voltage Vdds, a precharge voltage Vb1 and a cell plate voltage Vcp. Voltage generating circuit 370 supplies array operation voltage Vdds thus generated to sense amplifier 300, supplies precharge voltage Vb1 to the plurality of equalize circuits included in memory cell array 320 and supplies cell plate voltage Vcp to cell plate electrodes of the memory cells. Array operation voltage Vdds is used as a power supply voltage for amplifying the read data by sense amplifier 300. Precharge voltage Vb1 is used as a power supply voltage for equalizing bit line pair BLm and /BLm by the corresponding equalize circuit. Cell plate voltage Vcp is used for holding the data, which is written into the memory cell, in the memory cell.

Through power supply terminal 380, DRAMs 11–28 receive the power supply voltage supplied from power supply terminal Vcc of semiconductor module 100. Buffer 390 latches chip select signal CS sent from registered buffer 30 or 40, and outputs latched chip select signal CS to control circuit 391. When control circuit 391 receives chip select signal CS of L level from buffer 390, control circuit 391 determines that the DRAM (i.e., one of DRAMs 11–28) including itself is selected, and controls various portions of the DRAM.

Figure 3:
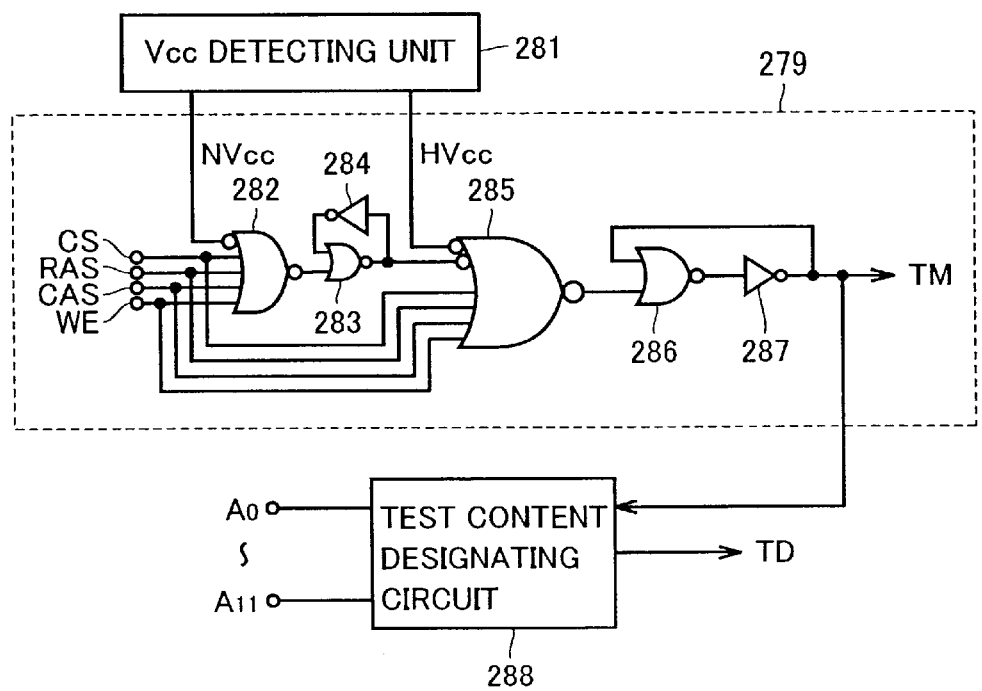
FIG. 3 is a circuit block diagram of a test mode circuit shown in FIG. 2.

Referring to FIG. 3, test mode circuit 280 includes a signal generating circuit 279, a Vcc detecting unit 281 and a test content designating circuit 288. Signal generating circuit 279 is formed of NOR gates 282, 283, 285 and 286, and inverters 284 and 287. Vcc detecting unit 281 detects the voltage levels of power supply voltages Vcc1 and Vcc2 in the manner which will be described later, and outputs logic signals NVcc and HVcc, which are results of the detection, to signal generating circuit 279.

In signal generating circuit 279, NOR gate 282 performs a logical OR on a signal, which is produced by inverting the logical level of logic signal NVcc sent from Vcc detecting unit 281, and signals MRS (which are formed of chip select signal CS, row address strobe signal RAS, column address strobe signal CAS and write enable signal WE) sent from registered buffer 30 or 40. NOR gate 282 sends a signal, which is produced by inverting a result of this logical operation, to NOR gate 283.

NOR gate 283 performs a logical OR on the output signal of NOR gate 282 and the output signal of inverter 284, and sends a signal produced by inverting a result of this logical operation to inverter 284 and NOR gate 285. Inverter 284 inverts the logical level of the output signal sent from NOR gate 283, and sends it to NOR gate 283. NOR gate 283 and inverter 284 form a latch circuit.

NOR gate 285 performs a logical OR on a signal produced by inverting the logical level of logic signal HVcc output from Vcc detecting unit 281, a signal produced by inverting the logical level of the output signal of NOR gate 283 and signals MRS sent from registered buffer 30 or 40. NOR gate 285 sends a signal produced by inverting a result of this logical operation to NOR gate 286.

NOR gate 286 performs a logical OR on the output signal of NOR gate 285 and the output signal of inverter 287, and sends a signal produced by inverting a result of this logical operation to inverter 287. Inverter 287 produces test mode signal TM by inverting the logical level of the output signal of NOR gate 286, and sends it to NOR gate 286, test content designating circuit 288 and control circuit 391. When test content designating circuit 288 receives test mode signal TM of H level after receiving test mode signal TM of L level, the test content designating circuit 288 determines contents of the test in accordance with the contents of address signals A0–A11 sent from registered buffer 30 or 40, and outputs test content designating signal TD for designating the test contents thus determined to control circuit 391.

Figure 4:
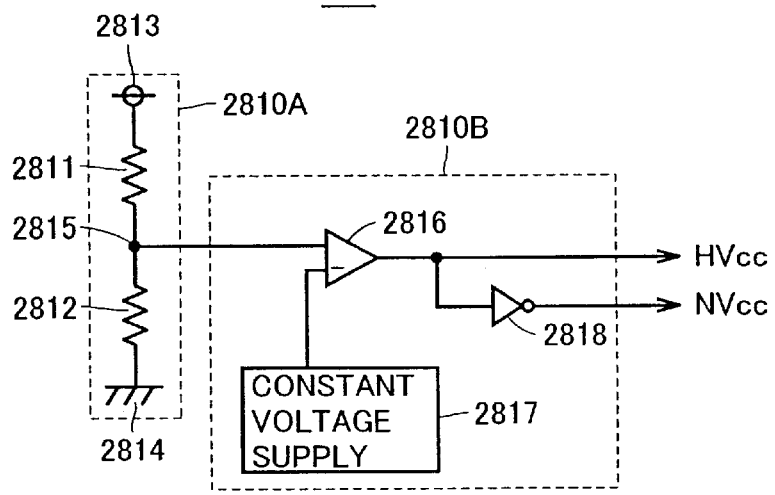
FIG. 4 is a circuit diagram of a Vcc detecting unit shown in FIG. 3.

Referring to FIG. 4, Vcc detecting unit 281 is formed of a voltage dividing circuit 2810A and a signal generating circuit 2810B. Voltage dividing circuit 2810A is formed of resistances 2811 and 2812. Resistances 2811 and 2812 are connected in series between a power supply node 2813 and a ground node 2814, and have the same resistance value. Power supply node 2813 receives power supply voltages Vcc1 or Vcc2 from power supply terminal 380. Therefore, voltage dividing circuit 2810A divides the power supply voltage Vcc1 (or Vcc2) to produce half the original voltage, i.e., divided voltage (½)Vcc1 (or (½)Vcc2), and sends it from a node 2815 to comparator 2816.

Signal generating circuit 2810B is formed of a comparator 2816, a constant voltage supply 2817 and an inverter 2818. Comparator 2816 receives on its negative terminal a reference voltage from constant voltage supply 2817, and receives on its positive terminal a voltage on node 2815. Comparator 2816 compares the voltage level of divided voltage (½)Vcc1 (or (½)Vcc2) received on the positive terminal with the voltage level of the reference voltage received on the negative terminal, and outputs logic signal HVcc, which has the logical level corresponding to a result of the comparison, to inverter 2818 and NOR gate 285 of signal generating circuit 279. Constant voltage supply 2817 outputs the constant voltage to the negative terminal of comparator 2816. More specifically, constant voltage supply 2817 outputs the constant voltage of 2.0 V to comparator 2816. Inverter 2818 inverts the logical level of logic signal HVcc sent from comparator 2816, and outputs signal NVcc to NOR gate 282 of signal generating circuit 279.

In this invention, when DRAMs 11–28 included in semiconductor modules 100 and 110 are to be shifted to the test mode, semiconductor module 100 receives signals MRS1, which are formed of row address strobe signal RAS of L level, column address strobe signal CAS of L level, write enable signal WE of L level and chip select signal CS of L level, and power supply voltage Vcc1 in the normal operation, and thereafter receives signals MRS2, which are formed of row address strobe signal RAS of L level, column address strobe signal CAS of L level, write enable signal WE of L level and chip select signal CS of L level, and power supply voltage Vcc2 higher in voltage level than power supply voltage Vcc1 in the normal operation.

Figure 5:
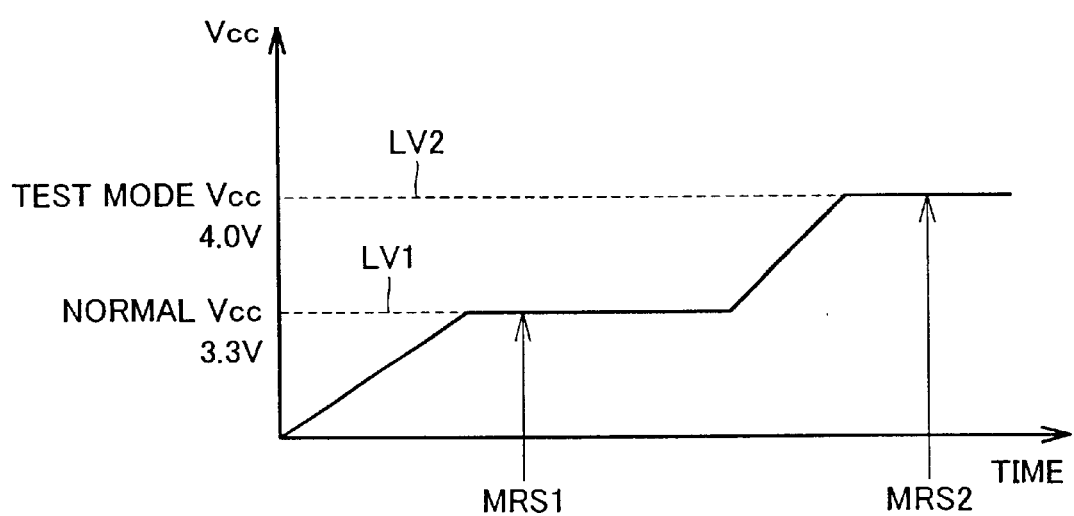
FIG. 5 is a timing chart showing a power supply voltage supplied to the DRAM in the first embodiment.

More specifically, referring to FIG. 5, for shifting DRAMs 11–28 to the test mode, signals MRS1 are supplied to semiconductor module 100 while the power supply voltage is power supply voltage Vcc1 of 3.3 V in the normal operation. Thereafter, the power supply voltage is raised to supply power supply voltage Vcc2 of 4.0 V higher in voltage level than power supply voltage Vcc1 in the normal operation, and signals MRS2 are supplied to semiconductor module 100. Test mode circuit 280 included in each of DRAMs 11–28 detects power supply voltage Vcc1 of 3.3 V in accordance with signals MRS1, and thereafter detects power supply voltage Vcc2 of 4.0 V in accordance with signals MRS2. Thereby, test mode circuit 280 detects the shift to the test mode.

Signals MRS1 and MRS2 form the test mode shift signals for shifting DRAMs 11–28 to the test mode.

Figure 6:
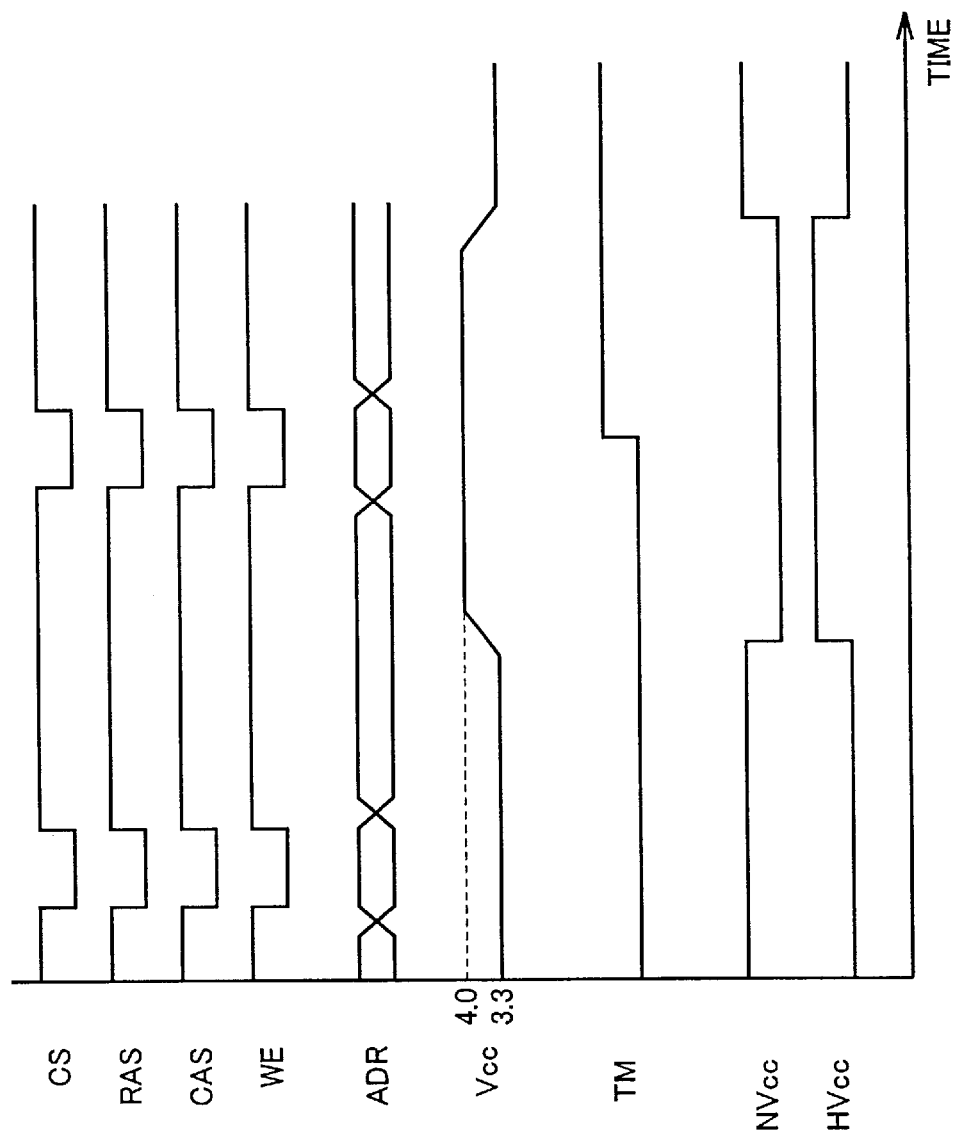
FIG. 6 is a timing chart of signals showing an operation of shifting to a test mode.

Referring to FIG. 6, description will now be given on the operation for shifting DRAMs 11–28 included in semiconductor modules 100 and 110 to the test mode. When semiconductor module 100 receives signals MRS1, which are formed of row address strobe signal RAS of L level, column address strobe signal CAS of L level, write enable signal WE of L level and chip select signal CS of L level, and an address signal ADR for the test mode, registered buffers 30 and 40 receive signals MRS1 and address signal ADR. Registered buffer 30 outputs signals MRS1 and address signal ADR to DRAMs 11–19 in synchronization with clock signal CLK sent from PLL circuit 50. Registered buffer 40 outputs signals MRS1 and address signal ADR to DRAMs 20–28 in synchronization with clock signal CLK sent from PLL circuit 50.

Further, semiconductor module 100 receives power supply voltage Vcc1 from power supply terminal Vcc, and power supply voltage Vcc1 thus received is supplied to DRAMs 11–19 as well as DRAMs 20–28 included in semiconductor module 110.

Thereby, test mode circuits 280 in each of DRAMs 11–28 operates to detect the voltage level of power supply voltage Vcc1 by Vcc detecting unit 281. More specifically, voltage dividing circuit 2810A in Vcc detecting unit 281 divides power supply voltage Vcc1, which is supplied to power supply node 2813, to produce half the original voltage, and outputs the divided voltage ($\frac{1}{2}$)Vcc1 to comparator 2816. Comparator 2816 receives voltage ($\frac{1}{2}$)Vcc1 on its positive terminal, and receives on its negative terminal the constant voltage from constant voltage supply 2817. In this case, comparator 2816 receives the constant voltage of 2.0 V from constant voltage supply 2817.

Thereby, comparator 2816 compares the voltage level of voltage ($\frac{1}{2}$)Vcc1 with the voltage level of the constant voltage, and outputs logic signal HVcc of L level because voltage ($\frac{1}{2}$)Vcc1 (=3.3/2) is lower in voltage level than constant voltage of 2.0 V. Inverter 2818 outputs logic signal NVcc of H level produced by inverting the logical level of logic signal NVcc. Therefore, Vcc detecting unit 281 outputs logic signal HVcc of L level and logic signal NVcc of H level serving as the level signal of power supply voltage Vcc1 to signal generating circuit 279.

Thereby, NOR gate 282 of signal generating circuit 279 outputs a signal of H level to NOR gate 283 based on logic signal NVcc of H level, chip select signal CS of L level, row address strobe signal RAS of L level, column address strobe signal CAS of L level and write enable signal WE of L level. Based on the signal of H level, NOR gate 283 and inverter 284 output a signal of L level latched thereby to NOR gate 285. NOR gate 285 outputs a signal of L level to NOR gate 286 based on logic signal HVcc of L level, the signal of L level sent from NOR gate 283, chip select signal CS of L level, row address strobe signal RAS of L level, column address strobe signal CAS of L level and write enable signal WE of L level. NOR gate 286 outputs a signal of H level to inverter 287, and inverter 287 outputs test mode signal TM of L level to NOR gate 286, test content designating circuit 288 and control circuit 391.

Thereafter, power supply voltage Vcc2 of 4.0 V is supplied from power supply terminal Vcc to semiconductor module 100, and signals MRS2 are input to semiconductor module 100. Thereby, registered buffers 30 and 40 send signals MRS2 to DRAMs 11–28 by the same operations as those for signals MRS1. Power supply voltage Vcc2 is supplied to DRAMs 11–28 similarly to power supply voltage Vcc1.

In test mode circuit 280 of each of DRAMs 11–28, Vcc detecting unit 281 operates to detect the voltage level of power supply voltage Vcc2. More specifically, voltage dividing circuit 2810A of Vcc detecting unit 281 divides power supply voltage Vcc2, which is supplied to power supply node 2813, to produce half the original voltage, and outputs divided voltage ($\frac{1}{2}$)Vcc2 to comparator 2816. Comparator 2816 receives voltage ($\frac{1}{2}$)Vcc2 on its positive terminal, and receives the constant voltage from constant voltage supply 2817 on its negative terminal.

Comparator 2816 compares the voltage level of voltage ($\frac{1}{2}$)Vcc2 with the voltage level of the constant voltage, and outputs logic signal HVcc of H level because voltage ($\frac{1}{2}$)Vcc2 of 4.0/2 V is equal in voltage level to the constant voltage of 2.0 V. Inverter 2818 outputs logic signal NVcc of L level produced by inverting the logical level of logic signal HVcc. Therefore, Vcc detecting unit 281 outputs, as the level signal of power supply voltage Vcc2, logic signal HVcc of H level and logic signal NVcc of L level to signal generating circuit 279.

Thereby, NOR gate 282 of signal generating circuit 279 outputs a signal of L level to NOR gate 283 based on logic signal NVcc of L level, chip select signal CS of L level, row address strobe signal RAS of L level, column address strobe signal CAS of L level and write enable signal WE of L level. NOR gate 283 and inverter 284 outputs a latched signal of H level to NOR gate 285 based on the signal of L level. NOR gate 285 outputs a signal of H level to NOR gate 286 based on logic signal HVcc of H level, the signal of H level sent from NOR gate 283, chip select signal CS of L level, row address strobe signal RAS of L level, column address strobe signal CAS of L level and write enable signal WE of L level. NOR gate 286 outputs a signal of L level to inverter 287, and inverter 287 outputs test mode signal TM of H level to NOR gate 286, test content designating circuit 288 and control circuit 391.

As described above, test mode circuit 280 generates test mode signal TM of L level when it receives power supply voltage Vcc1 in the normal operation and signals MRS1. Also, test mode circuit 280 generates test mode signal TM of H level when it receives power supply voltage Vcc2 for the test mode, which is higher in voltage level than power supply voltage Vcc1 in the normal operation, and signals MRS2.

When test content designating circuit 288 receives test mode signal TM of H level after receiving test mode signal TM of L level, test content designating circuit 288 determines the contents of test in accordance with the contents of address signals ADR (A0–A11) sent from registered buffer 30 or 40, and outputs test content designating signal TD designating the determined test contents to control circuit 391.

When control circuit 391 receives test mode signal TM of H level after receiving test mode signal TM of L level, it detects the fact that DRAMs 11–28 are shifted to the test mode. Thereby, control circuit 391 controls various portions of DRAMs 11–28 to perform the test of the contents designated by test content designating signal TD sent from test content designating circuit 288. More specifically, control circuit 391 controls the peripheral circuits such as column decoder 290, which are required for input/output of data, so that input/output of data to and from the memory cells may be performed in accordance with the test contents designated by test content designating signal TD.

The test contents designated by test content designating signal TD are used for testing a special operation different from the normal operation. Accordingly, test mode signals TM at L- and H levels serve to shift DRAMs 11–28 to the test mode for testing the special operation.

In the test mode, the operations of inputting and outputting data to and from the plurality of memory cells included in memory cell array 320 are the same as those of inputting and outputting the data to and from the memory cells in the normal operation, and therefore, description thereof is not repeated.

In the above manners, DRAMs 11–28 included in semiconductor modules 100 and 110 are tested.

Figure 7:
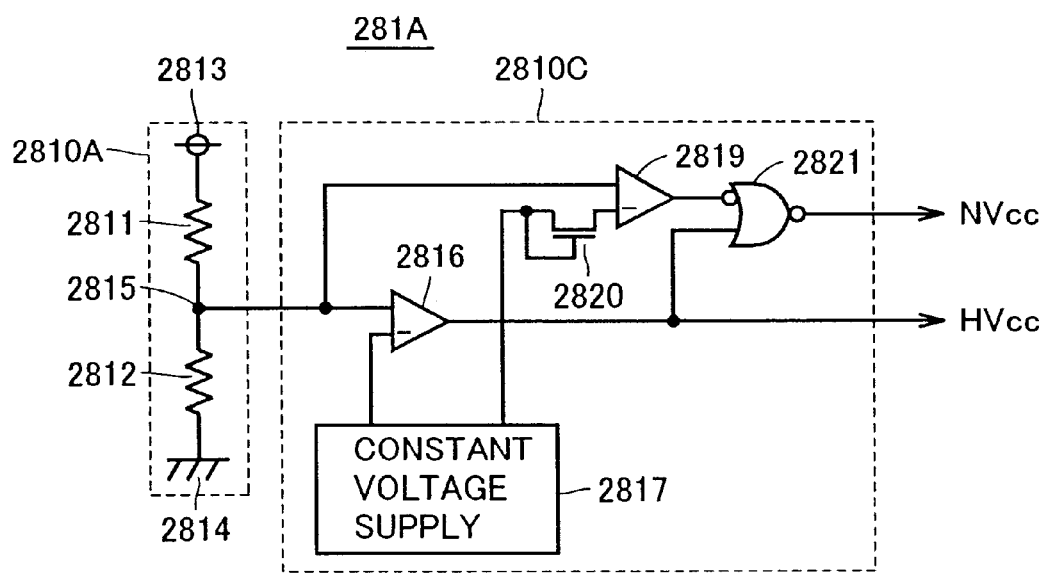
FIG. 7 is another circuit block diagram of the test mode circuit shown in FIG. 2.

In the first embodiment, Vcc detecting unit 281A shown in FIG. 7 may be employed as the Vcc detecting unit in test mode circuit 280. Vcc detecting unit 281A differs from Vcc detecting unit 281 only in that a signal generating circuit 2810C is employed instead of signal generating circuit 2810B. Other structures are the same as those Vcc detecting unit 281. Signal generating circuit 2810C differs from signal generating circuit 2810B in that inverter 2818 in signal generating circuit 2810B is removed, and a comparator 2819, an N-channel MOS transistor 2820 and an NOR gate 2821 are additionally employed. Structures other than the above are the same as those of signal generating circuit 2810B.

Comparator 2819 receives on its positive terminal the voltage on node 2815, and receives on its negative terminal the constant voltage supplied from constant voltage supply 2817 via N-channel MOS transistor 2820. NOR gate 2821 performs a logical OR on a signal, which is produced by inverting a logical level of an output signal of comparator 2819, and the output signal of comparator 2816, and outputs logic signal NVcc produced by inverting a result of this logical operation.

N-channel MOS transistor 2820 usually has a threshold voltage Vth of about 0.5 V, and comparator 2819 receives on its negative terminal a constant voltage equal to ((constant voltage)−0.5=2.0−0.5=1.5 V). Therefore, comparator 2819 outputs the signal of L level when the voltage level of divided voltage ($\frac{1}{2}$)Vcc1 (or ($\frac{1}{2}$)Vcc2) produced by dividing circuit 2810A is lower than 1.5 V. When the voltage level of voltage ($\frac{1}{2}$)Vcc1 (or ($\frac{1}{2}$)Vcc2) is higher than 1.5 V, comparator 2819 outputs the signal of H level.

Thereby, when voltage ($\frac{1}{2}$)Vcc1 is lower than 1.5 V, NOR gate 2821 outputs logic signal NVcc of L level, and comparator 2816 outputs logic signal HVcc of L level. Consequently, in the low voltage region where voltage ($\frac{1}{2}$)Vcc1 is lower than 1.5 V, signal generating circuit 279 generates test mode signal TM of L level (see FIG. 2).

When voltage ($\frac{1}{2}$)Vcc1 is equal to or higher than 1.5 V, and is lower than 2.0 V, comparator 2819 outputs the signal of H level to NOR gate 2821, and comparator 2816 outputs logic signal HVcc of L level. Thereby, NOR gate 2821 outputs logic signal NVcc of H level. Consequently, signal generating circuit 279 generates test mode signal TM of L level (see FIG. 2).

When voltage ($\frac{1}{2}$)Vcc1 rises to or above 2.0 V, comparator 2819 outputs the signal of H level to NOR gate 2821, and comparator 2816 outputs logic signal HVcc of H level. NOR gate 2821 outputs logic signal NVcc of L level. As a result, signal generating circuit 279 generates test mode signal TM of H level (see FIG. 2).

As described above, Vcc detecting unit 281A outputs logic signals HVcc and NVcc for outputting test mode signal TM of L level even when voltage ($\frac{1}{2}$)Vcc1 rises to the voltage level satisfying a relationship of (1.5 V≦voltage ($\frac{1}{2}$)Vcc1<2.0 V). Therefore, Vcc detecting unit 281A detects the voltage level of power supply voltage Vcc1 after the power supply voltage Vcc1 rises to the stable voltage level of or above 1.5 V. Therefore, a malfunction can be prevented more effectively than Vcc detecting unit 281. Thus, such a situation does not occur that DRAMs 11–28 erroneously enter the test mode due to variations in voltage level of power supply voltage Vcc1 during rising of power supply voltage Vcc1.

As is done in signal generating circuit 2810C, the voltage level of the divided voltage produced by voltage dividing circuit 2810A is compared with the two different voltage levels to generate the level signals indicating the voltage levels of power supply voltages Vcc1 and Vcc2. Thereby, the voltage levels of power supply voltages Vcc1 and Vcc2 can be detected in the regions, where the voltage levels of power supply voltages Vcc1 and Vcc2 are stable.

Test mode circuit 280 using Vcc detecting unit 281A performs the operation for shifting to the test mode in the same manner as that using Vcc detecting unit 281.

In the operations described above, DRAMs 11–28 enter the test mode when the power supply voltage having voltage level LV2 higher than voltage level LV1 in the normal operation is detected after detecting the power supply voltage having voltage level LV1 in the normal operation. The first embodiment is not restricted to this, and may generally employ such a manner that two power supply voltages at different voltage levels are used, and DRAMs 11–28 enter the test mode when the power supply voltage with the higher voltage level is detected after detecting the power supply voltage with the lower voltage level.

According to the first embodiment, the DRAM includes the test mode circuit, which generates the test mode signal for shifting the DRAM to the test mode when the power supply voltage with the voltage level higher than that in the normal operation is detected after detecting the power supply voltage with the voltage level in the normal operation. Therefore, the DRAM can be shifted to the test mode while it is assembled in the semiconductor module.

[Second Embodiment]

Figure 8:
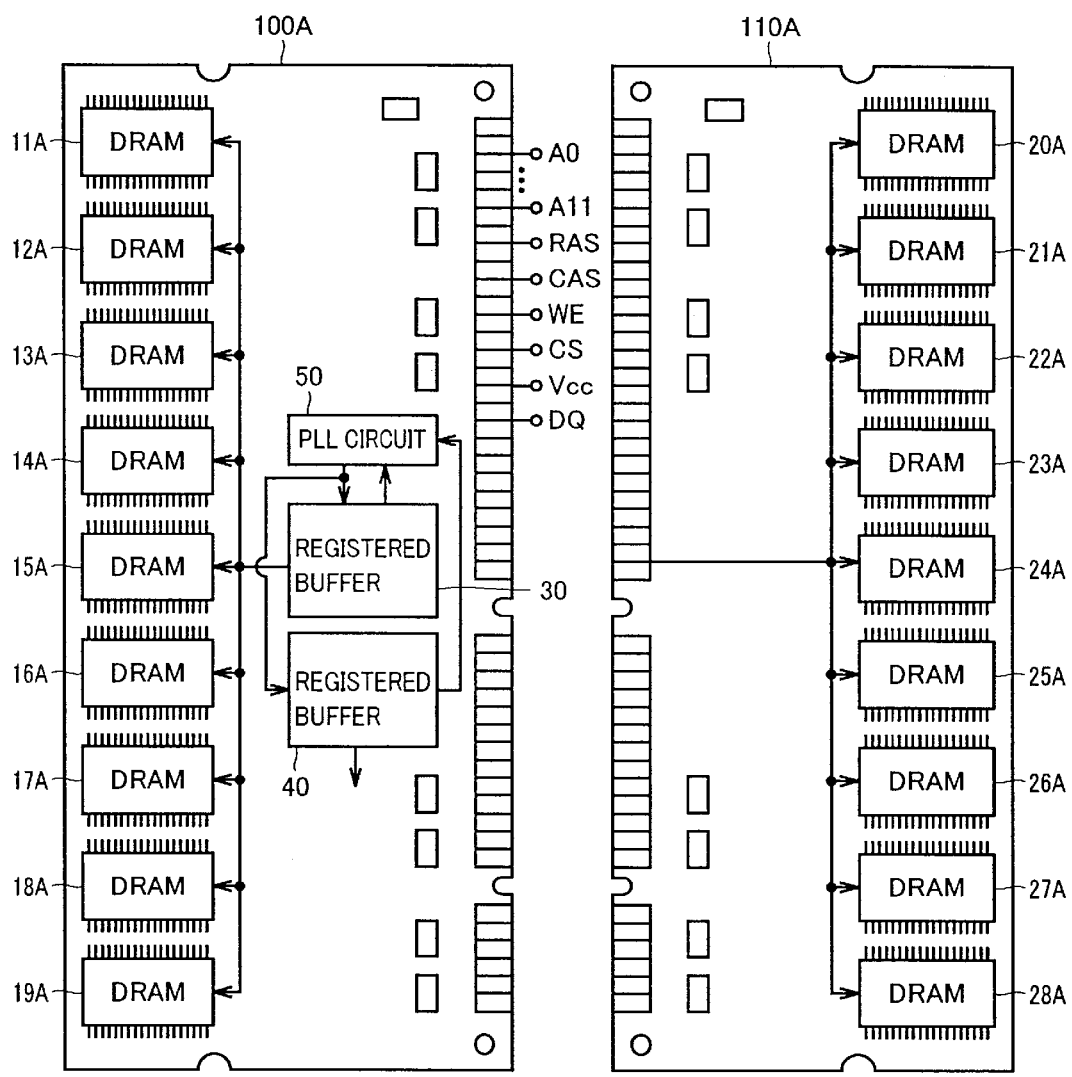
FIG. 8 is a schematic block diagram of a semiconductor module according to a second embodiment.

Referring to FIG. 8, semiconductor module 100A of a second embodiment differs from semiconductor module 100 in that DRAMs 11A–19A are employed instead of DRAMs 11–19. Other structures are the same as those of semiconductor module 100. A semiconductor module 110A in the second embodiment differs from semiconductor module 110 in that DRAMs 20A–28A are employed instead of DRAMs 20–28. Other structures are the same as those of semiconductor module 110.

Figure 9:
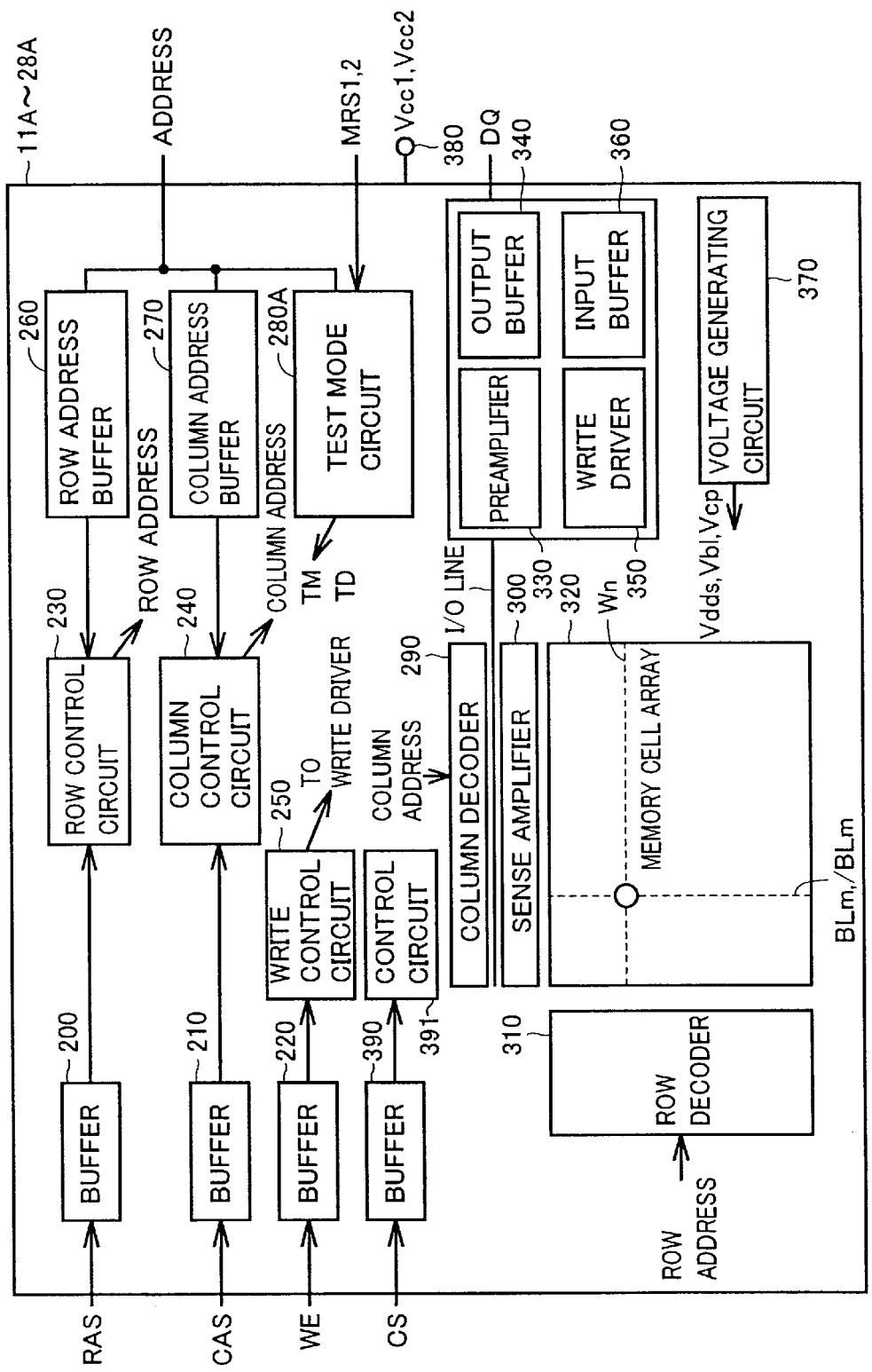
FIG. 9 is a schematic block diagram of a DRAM shown in FIG. 8.

Referring to FIG. 9, DRAMs 11A–28A differ from DRAMs 11–28 in that test mode circuits 280A are employed instead of test mode circuits 280, respectively. Other structures are the same as those of DRAMs 11–28.

Figure 10:
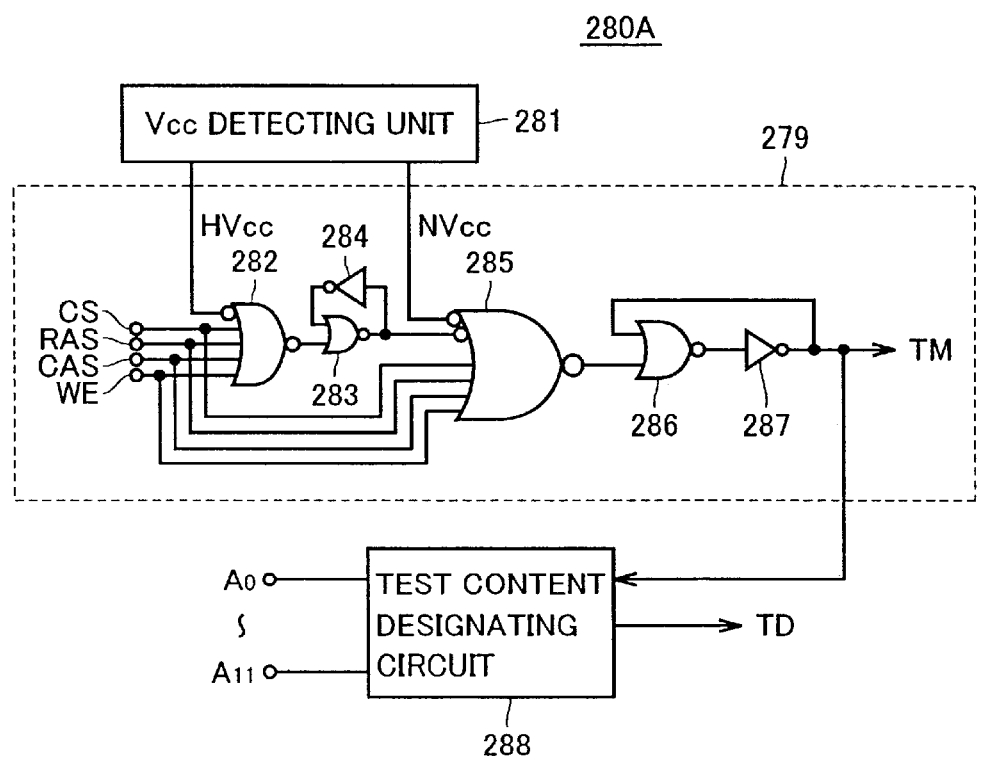
FIG. 10 is a circuit block diagram of a test mode circuit shown in FIG. 9.

Referring to FIG. 10, test mode circuit 280A is formed of Vcc detecting unit 281, signal generating circuit 279 and test content designating circuit 288. Thus, test mode circuit 280A has the same structure as test mode circuit 280. In test mode circuit 280A, however, Vcc detecting unit 281 outputs logic signal HVcc to NOR gate 282, and also outputs logic signal NVcc to NOR gate 285. In this point, test mode circuit 280A differs from test mode circuit 280.

Figure 11:
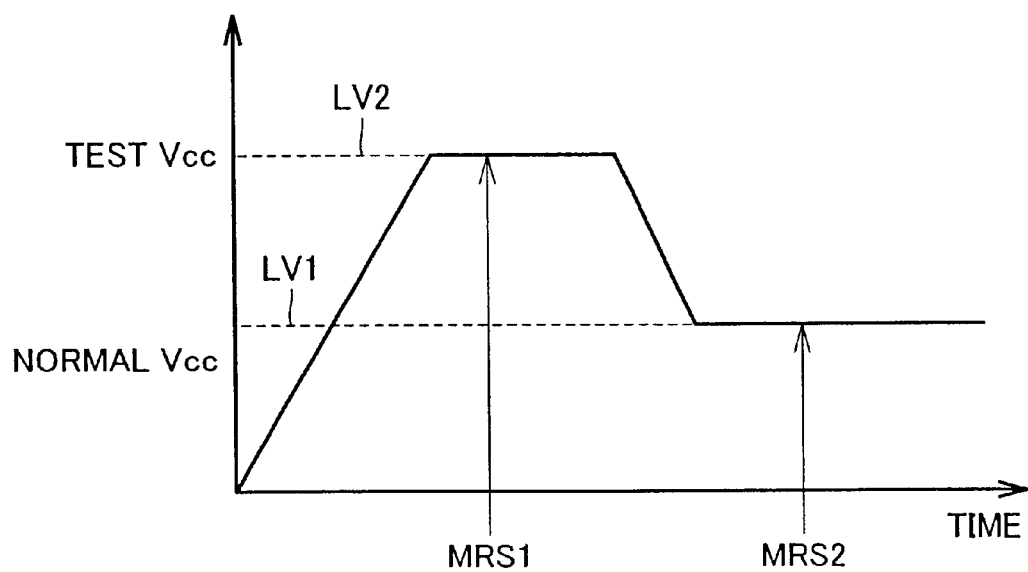
FIG. 11 is a timing chart of a power supply voltage supplied to the DRAM in the second embodiment.

Referring to FIG. 11, description will now be given on the method of shifting to the test mode in the second embodiment. In the second embodiment, signals MRS 1 are input to DRAMs 11A–28A while DRAMs 11A–28A are being supplied with power supply voltage Vcc2 with a higher level than power supply voltage Vcc1 used in the normal operation. Thereafter, signals MRS2 are supplied to DRAMs 11A–28A while DRAMs 11A–28A are being supplied with power supply voltage Vcc1 in the normal operation. Thus, test mode circuit 280A shifts DRAMs 11A–28A to the test mode when test mode circuit 280A detects, in accordance with signals MRS1, power supply voltage Vcc2 having voltage level LV2 higher than voltage level LV1 in the normal operation, and thereafter detects, in accordance with signals MRS2, power supply voltage Vcc1 having voltage level LV1 in the normal operation.

In this manner of shifting to the test mode, the order of supply of the power supply voltages with different voltage levels is the reverse of that in the test mode shifting operation of the first embodiment. In test mode circuit 280A, therefore, Vcc detecting unit 281 outputs logic signals HVcc and NVcc to the portions opposite to those in test mode circuit 280.

Description will now be given on the operations of shifting DRAMs 11A–28A included in semiconductor modules 100A and 110A to the test mode. The operations of supplying signals MRS1 and MRS2 as well as power supply voltages Vcc1 and Vcc2 are the same as those in the first embodiment already described.

When signals MRS1 and power supply voltage Vcc2 are supplied to DRAMs 11A–28A, voltage dividing circuit 2810A in Vcc detecting unit 281 of test mode circuit 280A divides power supply voltage Vcc2 of 4.0 V to produce half the original voltage, and outputs divided voltage (½)Vcc2 (=4.0/2=2.0 V) from node 2815 to comparator 2816. Comparator 2816 receives voltage (½)Vcc2 on its positive terminal, and receives on its negative terminal the constant voltage supplied from constant voltage supply 2817. In this case, comparator 2816 receives the constant voltage of 2.0 V from constant voltage supply 2817.

Thereby, comparator 2816 compares the voltage level of voltage (½)Vcc2 with the voltage level of the constant voltage, and outputs logic signal HVcc of H level because voltage (½)Vcc2 is equal to the voltage level of the constant voltage of 2.0 V. Inverter 2818 outputs logic signal NVcc of L level by inverting the logical level of logic signal HVcc. Therefore, Vcc detecting unit 281 outputs logic signal HVcc of H level and logic signal NVcc of L level to signal generating circuit 279 as the level signals of power supply voltage Vcc.

Thereby, NOR gate 282 of signal generating circuit 279 outputs a signal of H level to NOR gate 283 based on logic signal HVcc of H level, chip select signal CS of L level, row address strobe signal RAS of L level, column address strobe signal CAS of L level and write enable signal WE of L level. NOR gate 283 and inverter 284 output a latched signal of L level to NOR gate 285 based on the signal of H level. NOR gate 285 outputs a signal of L level to NOR gate 286 based on logic signal NVcc of L level, the signal of L level sent from NOR gate 283, chip select signal CS of L level, row address strobe signal RAS of L level, column address strobe signal CAS of L level and write enable signal WE of L level. NOR gate 286 outputs a signal of H level to inverter 287, and inverter 287 outputs test mode signal TM of L level to NOR gate 286, test content designating circuit 288 and control circuit 391.

Thereafter, power supply voltage Vcc1 of 3.3 V and signals MRS2 are supplied to DRAMs 11A–28A. Thereby, in test mode circuit 280A in each of DRAMs 11A–28A, Vcc detecting unit 281 detects the voltage level of power supply voltage Vcc1. More specifically, voltage dividing circuit 2810A of Vcc detecting unit 281 divides power supply voltage Vcc1 supplied to power supply node 2813 to produce half the original voltage, and outputs voltage (½)Vcc1 thus produced to comparator 2816. Comparator 2816 receives voltage (½)Vcc1 on its positive terminal, and also receives on its negative terminal the constant voltage from constant voltage supply 2817.

Comparator 2816 compares the voltage level of voltage (½)Vcc1 with the voltage level of the constant voltage, and outputs logic signal HVcc of L level because voltage (½) Vcc1 of 3.3/2 is lower in voltage level than the constant voltage of 2.0 V. Inverter 2818 outputs logic signal NVcc of H level produced by inverting the logical level of logic signal HVcc. Therefore, Vcc detecting unit 281 outputs logic signal HVcc of L level and logic signal NVcc of H level to signal generating circuit 279 as the level signals of power supply voltage Vcc1.

Thereby, NOR gate 282 of signal generating circuit 279 outputs a signal of L level to NOR gate 283 based on logic signal HVcc of H level, chip select signal CS of L level, row address strobe signal RAS of L level, column address strobe signal CAS of L level and write enable signal WE of L level. NOR gate 283 and inverter 284 output a signal of H level latched thereby to NOR gate 285 based on the signal of L level. NOR gate 285 outputs a signal of H level to NOR gate 286 based on logic signal HVcc of H level, the signal of H level sent from NOR gate 283, chip select signal CS of L level, row address strobe signal RAS of L level, column address strobe signal CAS of L level and write enable signal WE of L level. NOR gate 286 outputs a signal of L level to inverter 287, and inverter 287 outputs test mode signal TM of H level to NOR gate 286, test content designating circuit 288 and control circuit 391.

As described above, test mode circuit 280A generates test mode signal TM of L level when it receives power supply voltage Vcc2 with a higher level than power supply voltage Vcc1 in the normal operation as well as signals MRS1. Also, test mode circuit 280A generates test mode signal TM of H level when it receives power supply voltage Vcc1 in the normal operation and signals MRS2. Operations of DRAMs 11A–28A performed after the above operations are the same as those of the first embodiment already described.

The second embodiment may employ Vcc detecting unit 281A (see FIG. 7) instead of Vcc detecting unit 281 in test mode circuit 280A. Thereby, test mode circuit 280A can stably shift DRAMs 11A–28A to the test mode even when variations occur in power supply voltage Vcc2 during rising of power supply voltage Vcc2.

In the above description, DRAMs 11A–28A are shifted to the test mode when the power supply voltage having voltage level LV1 in the normal operation is detected after detecting the power supply voltage having voltage level LV2 higher than voltage level LV1 in the normal operation, as shown in FIG. 11. However, the second embodiment is not restricted to this, and may generally employ various manners provided that two power supply voltages at different voltage levels are used, and DRAMs 11A–28A are shifted to the test mode when the power supply voltage with a lower voltage level is detected after detecting the power supply voltage with a higher voltage level.

Operations other than the above are the same as those of the first embodiment.

According to the second embodiment, the DRAM includes the test mode circuit, which generates the test mode signal for shifting the DRAM to the test mode when the power supply voltage having the voltage level in the normal operation is detected after detecting the power supply voltage formed of the voltage level higher than the voltage level in the normal operation. Therefore, the DRAM can be shifted to the test mode even when it is assembled in the semiconductor module.

The DRAM using the power supply voltage of 4.0 V in the normal operation enters the test mode when the power supply voltage with a lower level than that of the power supply voltage in the normal operation is detected. Therefore, even the DRAM using the power supply voltage of 4.0 V in the normal operation can enter the test mode without a malfunction.

[Third Embodiment]

Figure 12:
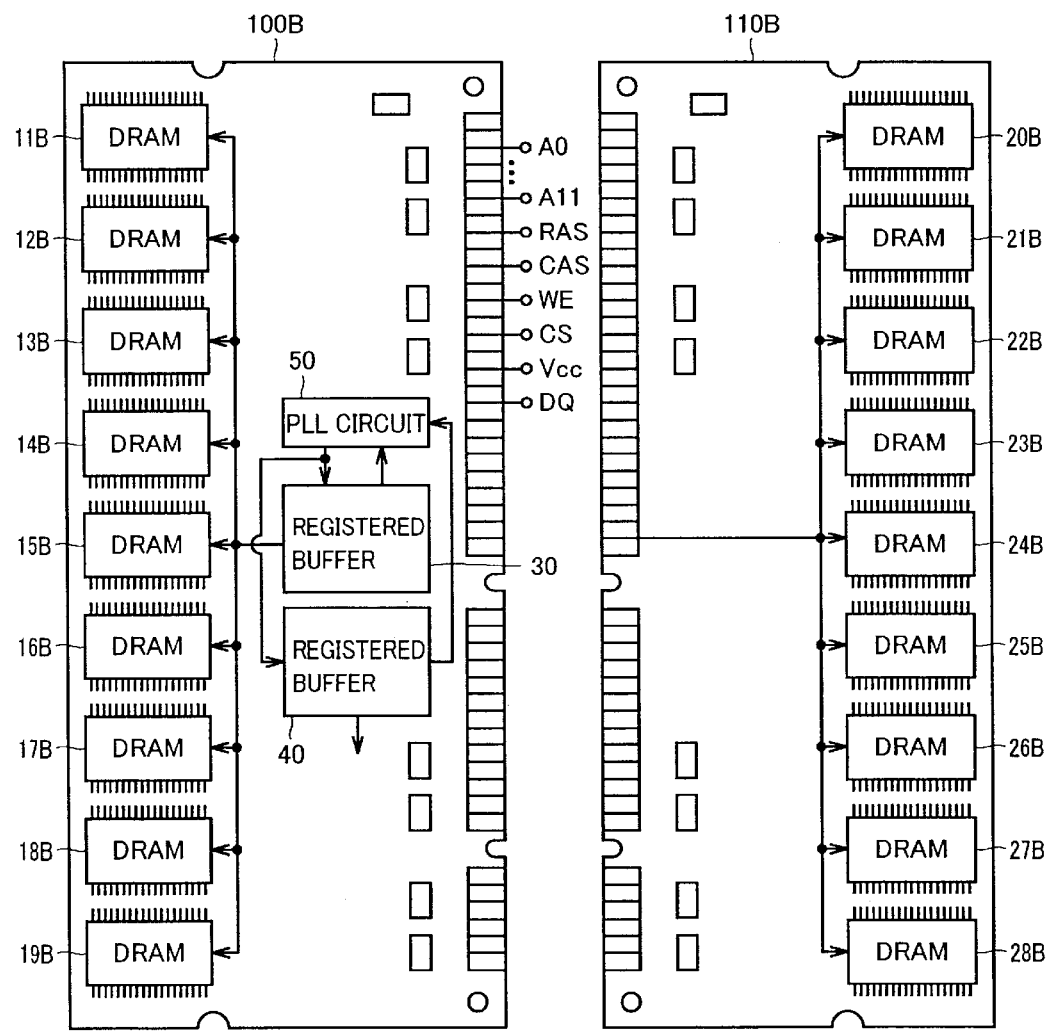
FIG. 12 is a schematic block diagram of a semiconductor module according to a third embodiment.

Referring to FIG. 12, a semiconductor module 100B according to a third embodiment differs from semiconductor module 100 in that DRAMs 11B–19B are employed instead of DRAMs 11–19. Other structures are the same as those of semiconductor module 100. A semiconductor module 110B of a third embodiment differs from semiconductor module 110 in that DRAMs 20B–28B are employed instead of DRAMs 20–28. Other structures are the same as those of semiconductor module 110.

Figure 13:
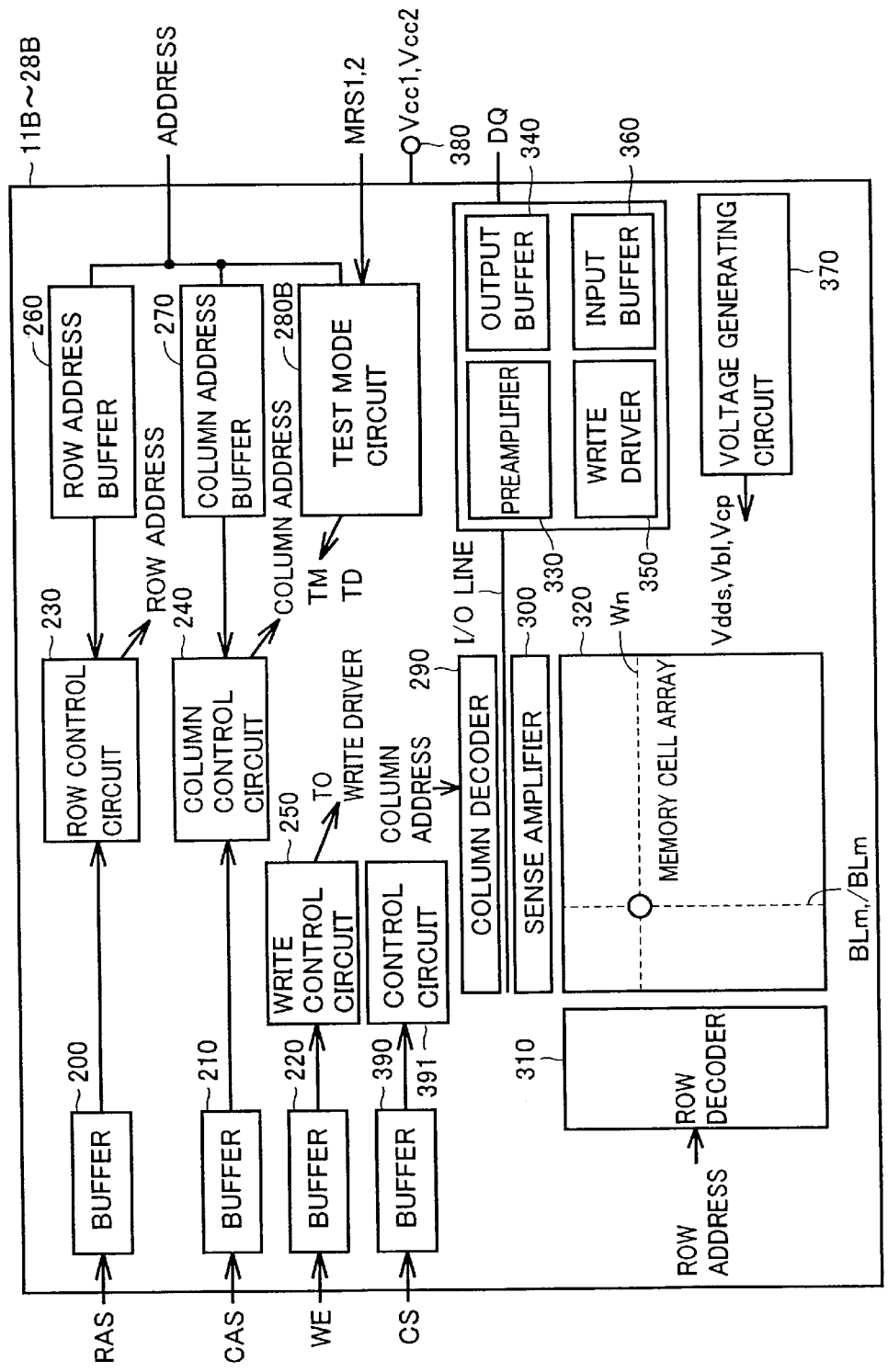
FIG. 13 is a schematic block diagram of a DRAM shown in FIG. 12.

Referring to FIG. 13, DRAMs 11B–28B differ from DRAMs 11–28 in that test mode circuits 280B are employed instead of test mode circuits 280, respectively. Other structures are the same as those of DRAMs 11–28.

Figure 14:
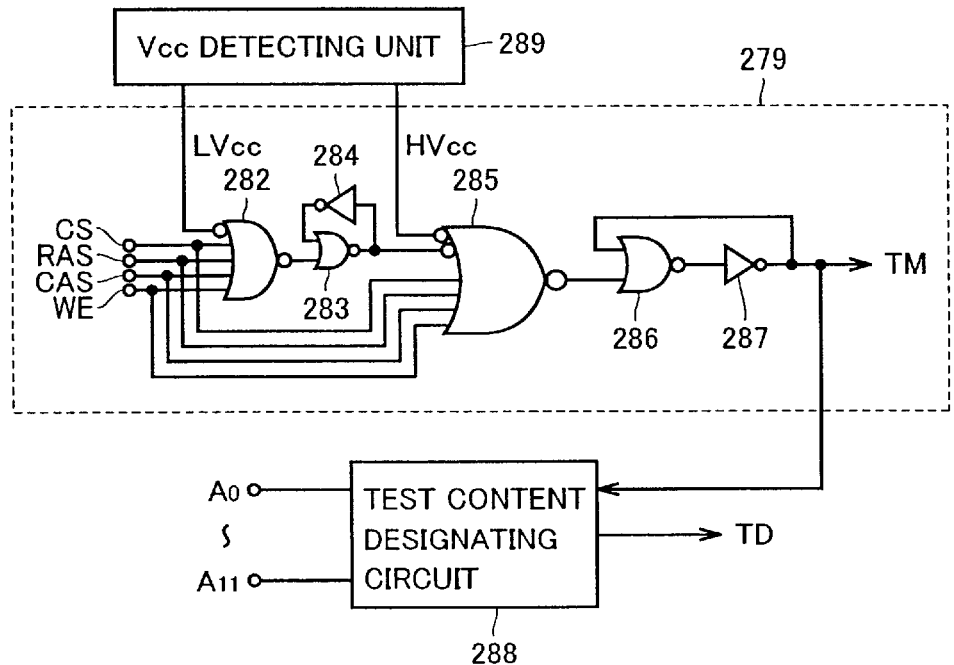
FIG. 14 is a circuit block diagram of a test mode circuit shown in FIG. 13.

Referring to FIG. 14, test mode circuit 280B differs from test mode circuit 280 in that a Vcc detecting unit 289 is employed instead of Vcc detecting unit 281. Other structures are the same as test mode circuit 280.

Figure 15:
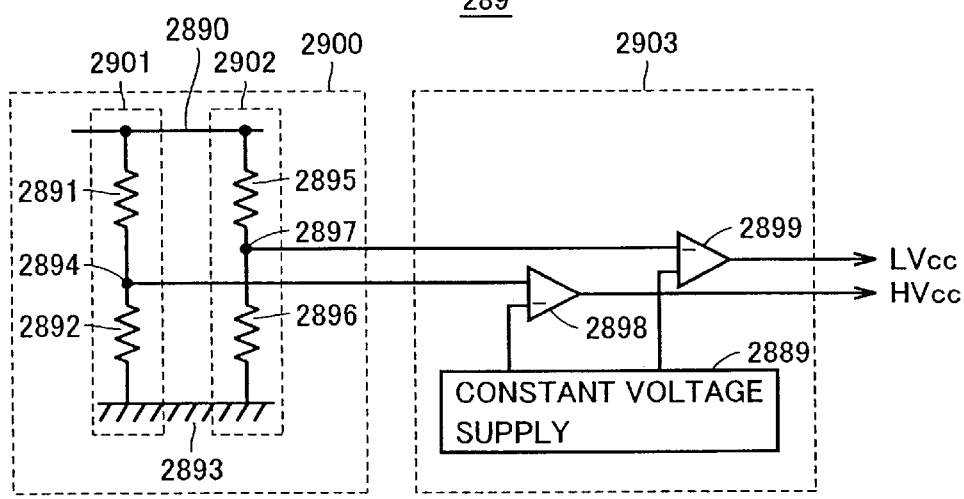
FIG. 15 is a circuit diagram of a Vcc detecting unit shown in FIG. 14.

Referring to FIG. 15, Vcc detecting unit 289 includes a voltage dividing unit 2900 and a signal generating circuit 2903. Voltage dividing unit 2900 is formed of voltage dividing circuits 2901 and 2902. Voltage dividing circuit 2901 is formed of resistances 2891 and 2892. Resistances 2891 and 2892 are connected in series between a power supply node 2890 and a ground node 2893. Resistance 2891 has the same resistance value as resistance 2892. Power supply node 2890 receives power supply voltages Vcc3 and Vcc4. Voltage dividing circuit 2901 divides a power supply voltage Vcc3 (or Vcc4) supplied to power supply node 2890 to produce half the original voltage, and outputs the divided voltage from a node 2894.

Voltage dividing circuit 2902 is formed of resistances 2895 and 2896. Resistances 2895 and 2896 are connected in series between power supply node 2890 and ground node 2893. Resistance 2895 has a resistance value R1, and resistance 2896 has a resistance value R2. Resistance values R1 and R2 satisfy a relationship of R1<R2. Accordingly, voltage dividing circuit 2902 outputs, from node 2897 a voltage Vcc-α, which is produced by lowering the voltage level of power supply voltage Vcc (Vcc3 or Vcc4) supplied to power supply node 2890 by α volts.

Signal generating circuit 2903 is formed of a constant voltage supply 2889 and comparators 2898 and 2899. Constant voltage supply 2889 outputs the constant voltage of 2.0 V to a negative terminal of comparator 2898 and a positive terminal of comparator 2899. Comparator 2898 compares the voltage, which is supplied from node 2894 of voltage dividing circuit 2901, with the constant voltage supplied from constant voltage supply 2889, and outputs logic signal HVcc corresponding to a result of the comparison to signal generating circuit 279. Comparator 2899 compares the constant voltage supplied from constant voltage supply 2889 with the voltage supplied from node 2897 of voltage dividing circuit 2902, and outputs a logic signal LVcc corresponding to a result of the comparison to signal generating circuit 279.

Figure 16:
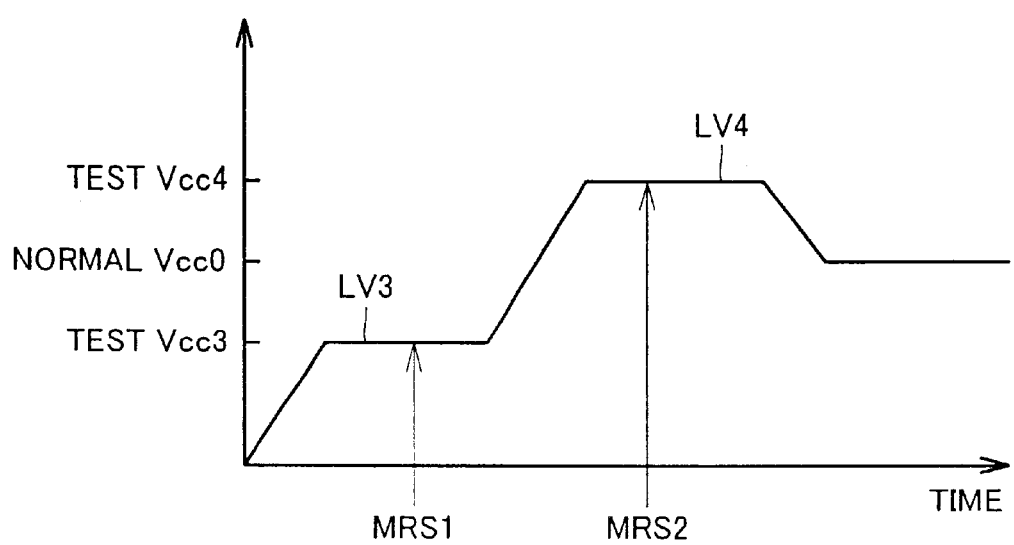
FIG. 16 is a timing chart of a power supply voltage supplied to the DRAM in the third embodiment.

Referring to FIG. 16, description will now be given on the manner of shifting DRAMs 11B–28B to the test mode in the third embodiment. In the third embodiment, power supply voltage Vcc3 with a lower voltage level than power supply voltage Vcc0 in the normal operation and power supply voltage Vcc4 with a higher voltage level than power supply voltage Vcc0 in the normal operation are used as the power supply voltages for shifting to the test mode. Signals MRS1 are input to DRAMs 11B–28B while supplying power supply voltage Vcc3 to DRAMs 11B–28B. Thereafter, signals MRS2 are input to DRAMs 11B–28B while supplying power supply voltage Vcc4 to DRAMs 11B–28B. Thus, test mode circuit 280B shifts DRAMs 11B–28B to the test mode when it detects power supply voltage Vcc3, which has a voltage level LV3 lower than voltage level LV1 in the normal operation, in accordance with signals MRS1, and thereafter detects power supply voltage Vcc4 having a voltage level LV4 higher than voltage level LV1 in the normal operation in accordance with signals MRS2.

Accordingly, voltage dividing circuit 2902 of Vcc detecting unit 289 lowers the voltage level of power supply voltage Vcc (Vcc3 or Vcc4) by voltage α, which satisfies relationships of (Vcc3-α<2.0 V) and (Vcc4-α>2.0V). The third embodiment employs relationships, e.g., of Vcc3=2.3 V, Vcc4=4.2 V and α=0.5 V.

DRAMs 11B–28B included in semiconductor modules 100B and 110B are shifted to the test mode by the following operations. The operations of supplying signals MRS1 and MRS2 as well as power supply voltages Vcc3 and Vcc4 to DRAMs 11B–28B are the same as those in the first embodiment.

When signals MRS1 and power supply voltage Vcc3 are supplied to DRAMs 11B–28B, voltage dividing circuit 2901 in Vcc detecting unit 289 of test mode circuit 280B divides power supply voltage Vcc3 of 2.3 V to produce half the original voltage, and outputs divided voltage (½)Vcc3 (=2.3/2 V) from node 2894 to comparator 2898. Voltage dividing circuit 2902 divides power supply voltage Vcc3 to lower the voltage level thereof only by 0.5 V, and outputs the voltage of 1.8 V from node 2897 to comparator 2899. Comparator 2898 receives voltage (½)Vcc3 on its positive terminal, and receives the constant voltage of 2.0 V supplied from constant voltage supply 2889 on its negative terminal.

Thereby, comparator 2898 compares the voltage level of voltage (½)Vcc3 with the voltage level of the constant voltage, and outputs logic signal HVcc of L level because voltage (½)Vcc3 is lower in voltage level than the constant voltage (2.0 V). Comparator 2899 compares the constant voltage (=2.0 V) with the voltage (1.8 V) supplied from voltage dividing circuit 2902, and outputs logic signal LVcc of H level. Therefore, Vcc detecting unit 289 outputs logic signal HVcc of L level and logic signal LVcc of H level as the level signals of power supply voltage Vcc3.

Thereby, NOR gate 282 of signal generating circuit 279 outputs a signal of H level to NOR gate 283 based on logic signal LVcc of H level, chip select signal CS of L level, row address strobe signal RAS of L level, column address strobe signal CAS of L level and write enable signal WE of L level. NOR gate 283 and inverter 284 output a signal of L level latched thereby to NOR gate 285. NOR gate 285 outputs a signal of L level to NOR gate 286 based on logic signal HVcc of L level, the signal of L level sent from NOR gate 283, chip select signal CS of L level, row address strobe signal RAS of L level, column address strobe signal CAS of L level and write enable signal WE of L level. NOR gate 286 outputs a signal of H level to inverter 287. Inverter 287 outputs test mode signal TM of L level to NOR gate 286, test content designating circuit 288 and control circuit 391.

Thereafter, power supply voltage Vcc4 of 4.2 V and signals MRS2 are supplied to DRAMs 11B–28B. Thereby, in test mode circuit 280B in each of DRAMs 11B–28B, Vcc detecting unit 289 detects the voltage level of power supply voltage Vcc4. More specifically, voltage dividing circuit 2901 of Vcc detecting unit 289 divides power supply voltage Vcc4 of 4.2 V to produce half the original voltage, and outputs divided voltage (½)Vcc4 to comparator 2898 from node 2894. Voltage dividing circuit 2902 divides power supply voltage Vcc4 to lower its voltage level only by 0.5 V, and outputs a voltage of 3.7 V from node 2897 to comparator 2899. Comparator 2898 receives voltage (½)Vcc4 on its positive terminal, and also receives on its negative terminal the constant voltage of 2.0 V from constant voltage supply 2889.

Thereby, comparator 2898 compares the voltage level of voltage (½)Vcc4 with the voltage level of the constant voltage, and outputs logic signal HVcc of H level because voltage (½)Vcc4 is higher than the voltage level of the constant voltage (2.0 V). Comparator 2899 compares the constant voltage of 2.0 V with the voltage of 3.7 V supplied from voltage dividing circuit 2902, and outputs logic signal LVcc of L level. Therefore, Vcc detecting unit 289 outputs logic signal HVcc of H level and logic signal LVcc of L level to signal generating circuit 279 as the level signals of power supply voltage Vcc4.

Thereby, NOR gate 282 of signal generating circuit 279 outputs a signal of L level to NOR gate 283 based on logic signal LVcc of L level, chip select signal CS of L level, row address strobe signal RAS of L level, column address strobe signal CAS of L level and write enable signal WE of L level. NOR gate 283 and inverter 284 output a latched signal of H level to NOR gate 285 based on the signal of L level. NOR gate 285 outputs a signal of H level to NOR gate 286 based on logic signal HVcc of H level, the signal of H level sent from NOR gate 283, chip select signal CS of L level, row address strobe signal RAS of L level, column address strobe signal CAS of L level and write enable signal WE of L level. NOR gate 286 outputs a signal of L level to inverter 287, and inverter 287 outputs test mode signal TM of H level to NOR gate 286, test content designating circuit 288 and control circuit 391.

As described above, test mode circuit 280B generates test mode signal TM of L level when it receives power supply voltage Vcc3 with a lower voltage level than power supply voltage Vcc0 in the normal operation as well as signals MRS1. Also, test mode circuit 280B generates test mode signal TM of H level when it receives power supply voltage Vcc4 with a higher level than power supply voltage Vcc0 in the normal operation and signals MRS2. Thereby, DRAMs 11B–28B enter the test mode.

Other operations are the same as those in the first embodiment.

According to a third embodiment, the DRAM includes the test mode circuit, which generates the test mode signal for shifting the DRAM to the test mode when the power supply voltage having the voltage level higher than the voltage level in the normal operation is detected after detecting the power supply voltage formed of the voltage level lower than the voltage level in the normal operation. Therefore, the DRAM can be shifted to the test mode even when it is assembled in the semiconductor module.

[Fourth Embodiment]

Figure 17:
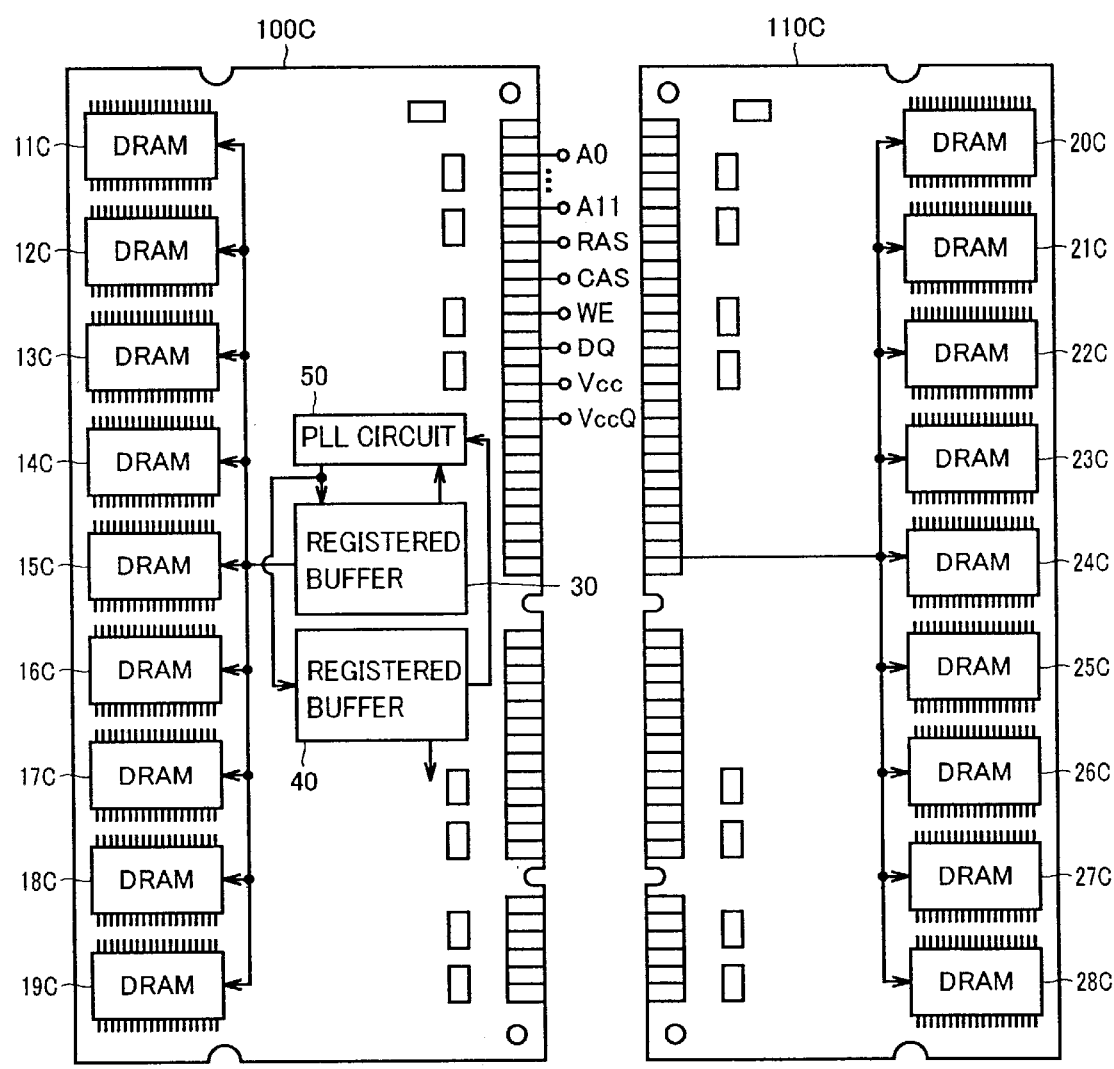
FIG. 17 is a schematic block diagram of a semiconductor module according to a fourth embodiment.

Referring to FIG. 17, a semiconductor module 100C of a fourth embodiment differs from semiconductor module 100 in that DRAMs 11C–19C are employed instead of DRAMs 11–19, and a power supply terminal for supplying a power supply voltage VccQ is additionally employed. Other structures are the same as those of semiconductor module 100. Semiconductor module 110C of the fourth embodiment differs from semiconductor module 110 in that DRAMs 20C–28C are employed instead of DRAMs 20–28, and other structures are the same as those of semiconductor module 110. Power supply voltage VccQ is dedicated to output. For shifting DRAMs 11C–28C to the test mode, semiconductor module 100C is externally supplied with two power supply voltages Vcc and VccQ, and DRAMs 11C–28C are supplied with two power supply voltages Vcc and VccQ.

Figure 18:
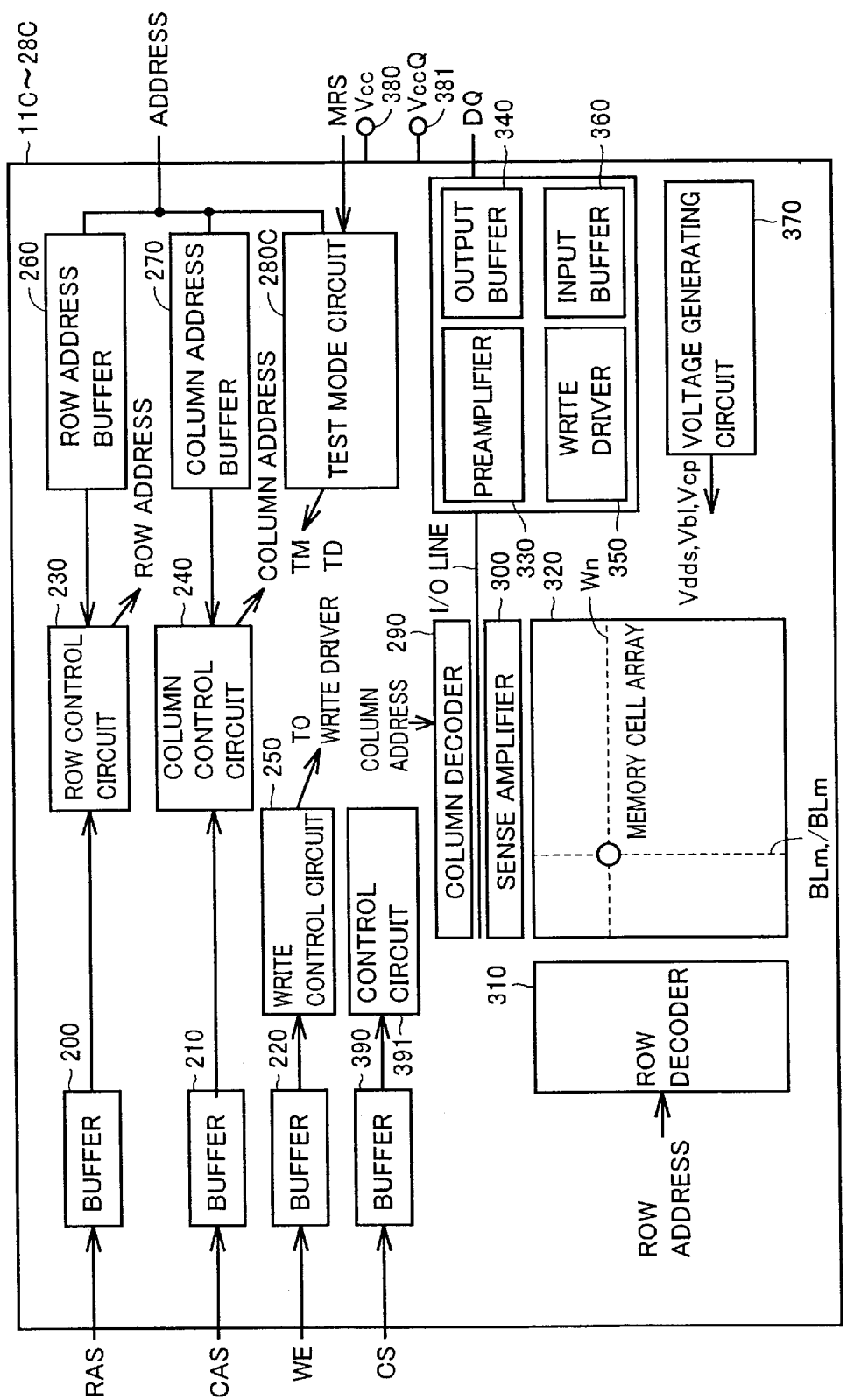
FIG. 18 is a schematic block diagram of a DRAM shown in FIG. 17.

Referring to FIG. 18, DRAMs 11C–28C differ from DRAMs 11–28 in that test mode circuits 280C are employed instead of test mode circuits 280, and power supply terminals 381 are employed, respectively. Other structures are the same as those of DRAMs 11–28. Power supply terminal 381 is provided for receiving power supply voltage VccQ dedicated to output. Therefore, test mode circuit 280C receives two power supply voltages Vcc and VccQ.

Figure 19:
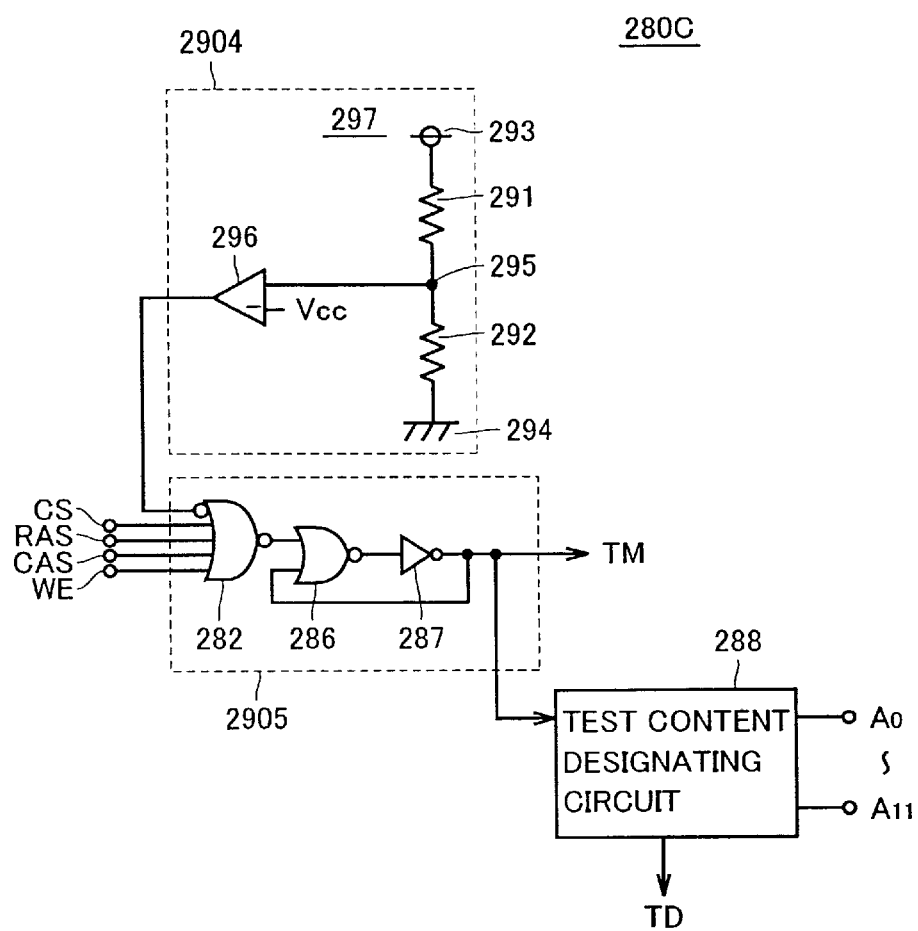
FIG. 19 is a circuit block diagram of a test mode circuit shown in FIG. 18.

Referring to FIG. 19, test mode circuit 280C includes a Vcc detecting unit 2904, a signal generating circuit 2905 and a test content designating circuit 288. The test content designating circuit 288 is the same as that already described.

Vcc detecting unit 2904 is formed of resistances 291 and 292, and a comparator 296. Resistances 291 and 292 are connected in series between a power supply node 293 and a ground node 294. Resistances 291 and 292 have the same resistance value. Resistances 291 and 292 form a voltage dividing circuit 297. Power supply node 293 is supplied with power supply voltage VccQ. Therefore, voltage dividing circuit 297 divides power supply voltage VccQ to produce half the original voltage, and outputs a divided voltage (½)VccQ from a node 295 to comparator 296. Comparator 296 receives power supply voltage Vcc on its negative terminal, and receives voltage (½)VccQ from voltage dividing circuit 297 on its positive terminal. Comparator 296 compares the voltage level of voltage (½)VccQ with the voltage level of power supply voltage Vcc, and outputs a logic signal having a logical level corresponding to a result of the comparison to signal generating circuit 2905.

Signal generating circuit 2905 is formed of NOR gates 282 and 286 as well as inverter 287. NOR gate 282 performs a logical OR on chip select signal CS, row address strobe signal RAS, column address strobe signal CAS, write enable signal WE and a signal produced by inverting a logic signal sent from comparator 296, and outputs a signal produced by inverting a result of this logical operation to NOR gate 286. NOR gate 286 performs a logical OR on an output signal of NOR gate 282 and an output signal of inverter 287, and outputs a signal produced by inverting a result of this logical operation to inverter 287. Inverter 287 inverts the signal sent from NOR gate 286, and outputs test mode signal TM to test content designating circuit 288 and control circuit 391.

Figure 20:
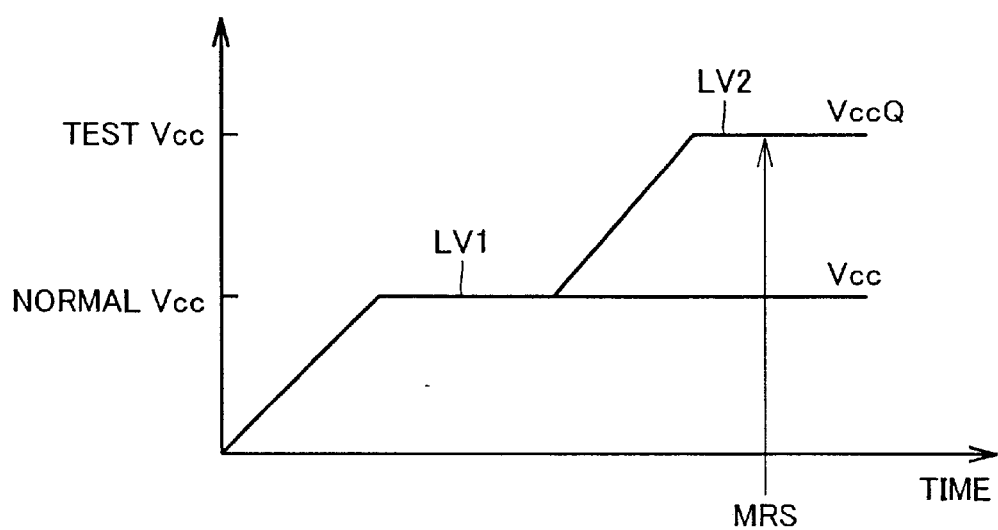
FIG. 20 is a timing chart of a power supply voltage supplied to the DRAM in the fourth embodiment.

Referring to FIG. 20, description will now be given on a method of shifting DRAMs 11C–28C to the test mode in the fourth embodiment. In the fourth embodiment, power supply voltage Vcc for the normal operation and power supply voltage VccQ with a higher level than power supply voltage Vcc are used as the power supply voltages for shifting to the test mode. For shifting to the test mode, signals MRS and power supply voltage VccQ are supplied to DRAMs 11C–28C. More specifically, test mode circuit 280C shifts DRAMs 11C-28c to the test mode when it detects power supply voltage VccQ having voltage level LV2 higher than voltage level LV1 in the normal operation in accordance with signals MRS.

Description will now be given on operations for shifting DRAMs 11C–28C included in semiconductor modules 100C and 110C to the test mode. Operations of supplying signals MRS and power supply voltage VccQ to DRAMs 11C–28C are the same as those of the first embodiment.

When signals MRS and power supply voltage VccQ ($\geq$2Vcc) are supplied to DRAMs 11C–28C while power supply voltage Vcc is being supplied to DRAMs 11C–28C, Vcc detecting unit 2904 in test mode circuit 280C divides power supply voltage Vcc to produce half the original voltage, and outputs a voltage ($\frac{1}{2}$)VccQ thus produced from node 295 to comparator 296. Comparator 296 compares the voltage level of voltage ($\frac{1}{2}$)VccQ received on its positive terminal with the voltage level of power supply voltage Vcc, and outputs a logic signal of H level to signal generating circuit 2905.

Thereby, NOR gate 282 of signal generating circuit 2905 outputs a signal of H level to NOR gate 286 based on the logic signal of H level sent from comparator 296, chip select signal CS of L level, row address strobe signal RAS of L level, column address strobe signal CAS of L level and write enable signal WE of L level. NOR gate 286 outputs the signal of L level to inverter 287. Inverter 287 outputs test mode signal TM of H level to test content designating circuit 288 and control circuit 391.

As described above, test mode circuit 280C generates test mode signal TM of H level when it receives signals MRS and power supply voltage VccQ with a higher level than power supply voltage Vcc in the normal operation. Operations of DRAMs 11C–28C after the above are the same as those in the first embodiment.

In the fourth embodiment, the two power supply voltages with different voltage levels are used, and the DRAM is shifted to the test mode when the power supply voltage with a higher voltage level is detected while the power supply voltage with a lower voltage level is being supplied.

Structures other than the above are the same as those of the first embodiment.

According to the fourth embodiment, the DRAM includes the test mode circuit, which generates the test mode signal for shifting the DRAM to the test mode when it detects the power supply voltage with the voltage level higher than that in the normal operation. Therefore, the DRAM can enter the test mode even when it is assembled in the semiconductor module.

In the fourth embodiment, the two power supply voltages with different voltage levels must be simultaneously supplied to the DRAM for shifting the DRAM to the test mode. In the usual operation, it can be hardly assumed that the two power supply voltages with different voltage levels are simultaneously supplied to the DRAM. Therefore, the DRAM can enter the test mode without a malfunction.

[Fifth Embodiment]

Figure 21:
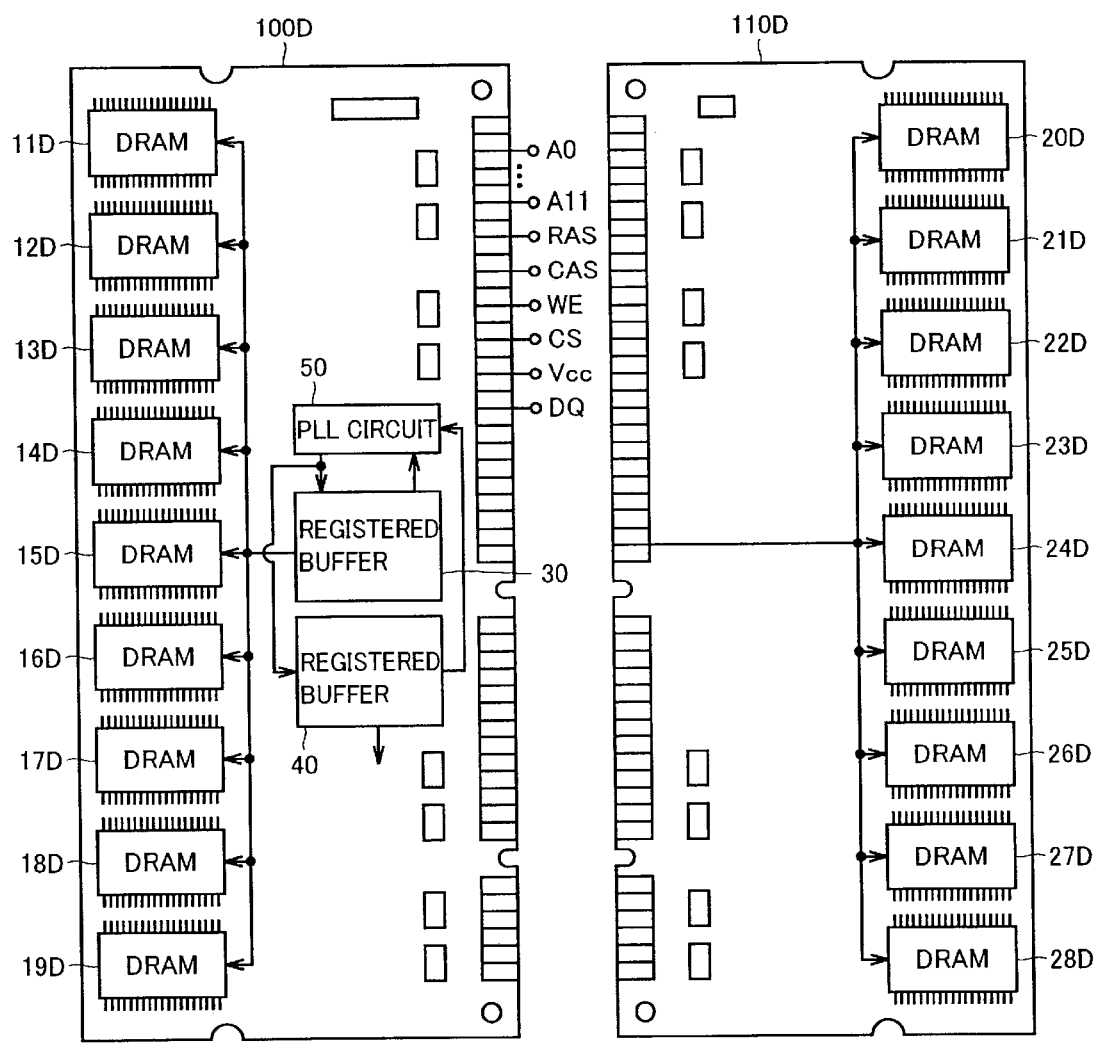
FIG. 21 is a schematic block diagram of a semiconductor module according to a fifth embodiment.

Referring to FIG. 21, a semiconductor module 100D of a fifth embodiment differs from semiconductor module 100 in that DRAMs 11D–19D are employed instead of DRAMs 11–19. Other structures are the same as those of semiconductor module 100. A semiconductor module 110D of the fifth embodiment differs from semiconductor module 110 in that DRAMs 20D–28D are employed instead of DRAMs 20–28, and other structures are the same as those of semiconductor module 110.

Figure 22:
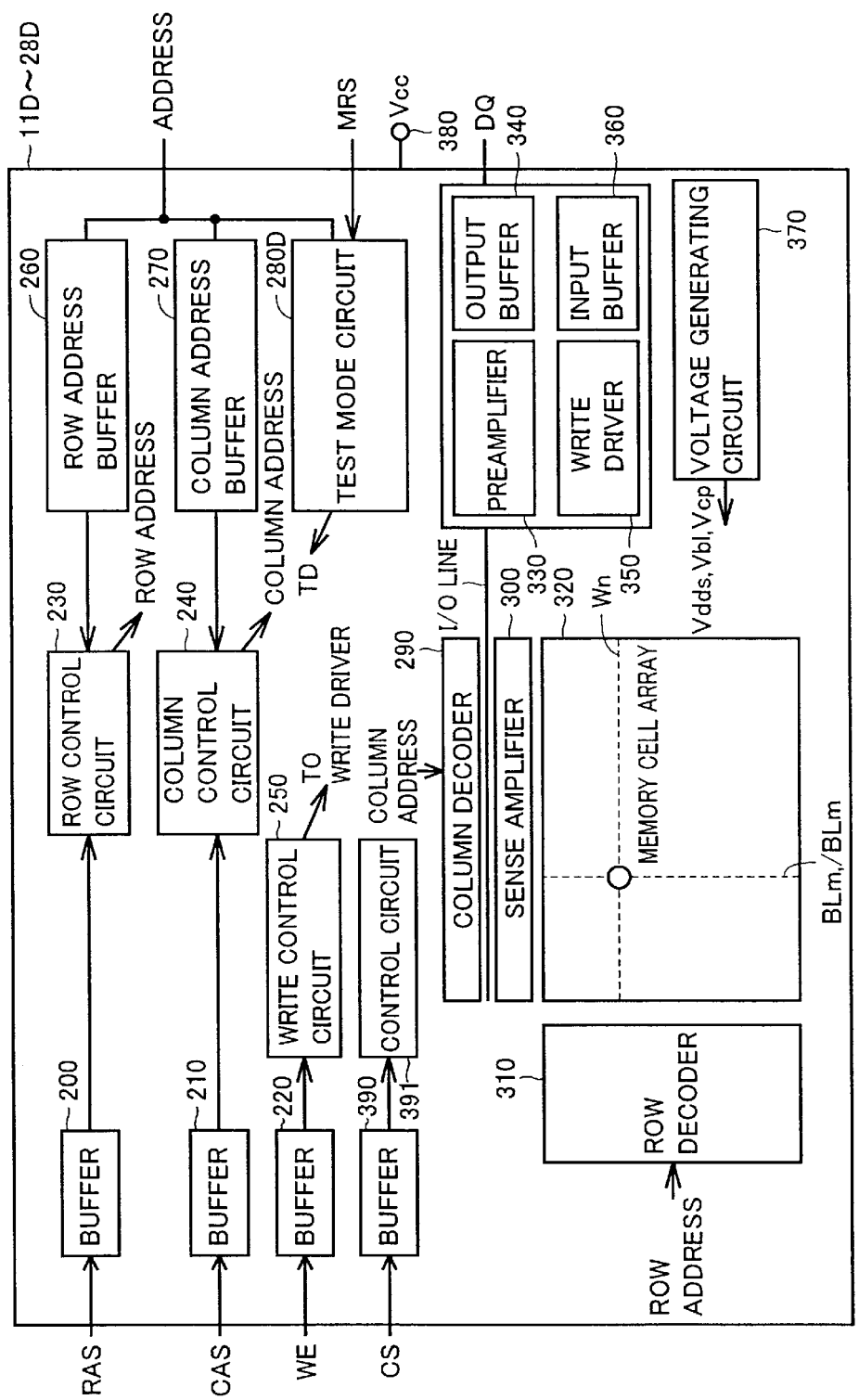
FIG. 22 is a schematic block diagram of a DRAM shown in FIG. 21.

Referring to FIG. 22, DRAMs 11D–28D differ from DRAMs 11–28 in that test mode circuits 280D are employed instead of test mode circuits 280, respectively. Other structures are the same as those of DRAMs 11–28. However, each of DRAMs 11D–28D receives signals MRS from registered buffer 30 or 40, and receives power supply voltage Vcc from power supply terminal 380.

Figure 23:
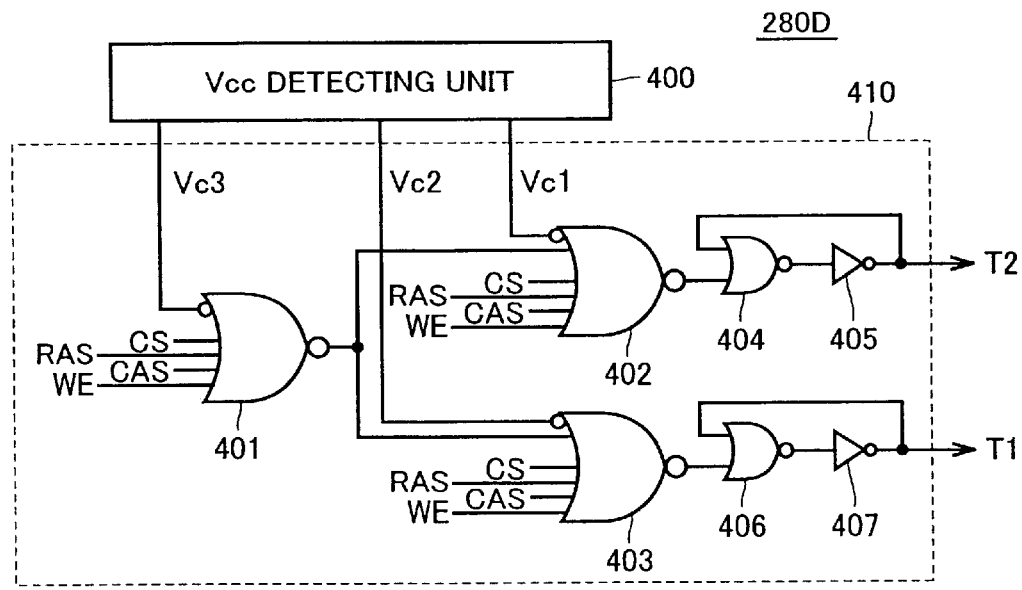
FIG. 23 is a circuit block diagram of a test mode circuit shown in FIG. 22.

Referring to FIG. 23, test mode circuit 280D includes a Vcc detecting unit 400 and a signal generating circuit 410. Vcc detecting unit 400 generates signals Vc1, Vc2 and Vc3 in a manner, which will be described later, and outputs these signals Vc1, Vc2 and Vc3 to signal generating circuit 410.

Signal generating circuit 410 is formed of NOR gates 401–404 and 406 as well as inverters 405 and 407. NOR gate 401 performs a logical OR on an inverted signal of signal Vc3, chip select signal CS, row address strobe signal RAS, column address strobe signal CAS and write enable signal WE, and outputs a signal produced by inverting a result of this logical operation to NOR gates 402 and 403. NOR gate 402 performs a logical OR on an inverted signal of signal Vc1, the output signal of NOR gate 401, chip select signal CS, row address strobe signal RAS, column address strobe signal CAS and write enable signal WE, and outputs a signal produced by inverting a result of this logical operation to NOR gate 404.

NOR gate 403 performs a logical OR on an inverted signal of signal Vc2, the output signal of NOR gate 401, chip select signal CS, row address strobe signal RAS, column address strobe signal CAS and write enable signal WE, and outputs a signal produced by inverting a result of this logical operation to NOR gate 406.

NOR gate 404 performs a logical OR on the output signal of NOR gate 402 and the output signal of inverter 405, and outputs a signal produced by inverting a result of this logical operation to inverter 405. Inverter 405 inverts the output signal of NOR gate 404, and outputs it as a signal T2 to NOR gate 404 and control circuit 391.

NOR gate 406 performs a logical OR on the output signal of NOR gate 403 and the output signal of inverter 407, and outputs a signal produced by inverting a result of this logical operation to inverter 407. Inverter 407 inverts the output signal of NOR gate 406, and outputs a signal T1 to NOR gate 406 and control circuit 391.

Figure 24:
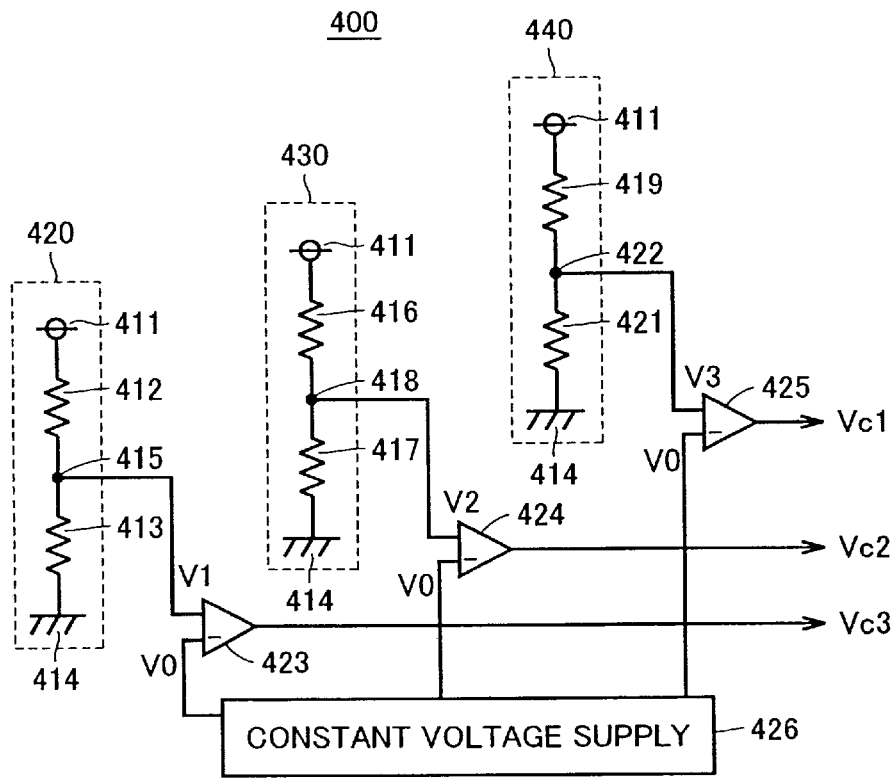
FIG. 24 is a circuit diagram of a Vcc detecting unit shown in FIG. 23.

Referring to FIG. 24, Vcc detecting unit 400 includes voltage dividing circuits 420, 430 and 440, comparators 423–425 and a constant voltage supply 426. Voltage dividing circuit 420 is formed of resistances 412 and 413. Resistances 412 and 413 are connected in series between power supply node 411 and ground node 414. Resistance 412 has a resistance value r1, and resistance 413 has a resistance value r2. Power supply node 411 is supplied with power supply voltage Vcc. Therefore, voltage dividing circuit 420 divides power supply voltage Vcc in accordance with a ratio between resistance values r1 and r2, and outputs a divided voltage V1 thus produced from node 415 to comparator 423.

Voltage dividing circuit 430 is formed of resistances 416 and 417. Resistances 416 and 417 are connected in series between power supply node 411 and ground node 414. Each of resistances 416 and 417 has a resistance value r3. Therefore, voltage dividing circuit 430 divides power supply voltage Vcc to produce half the original voltage, and outputs a divided voltage V2 thus produced from node 418 to a comparator 424.

Voltage dividing circuit 440 is formed of resistances 419 and 421. Resistances 419 and 421 are connected in series between power supply node 411 and ground node 414. Resistance 419 has resistance value r2, and resistance 421 has resistance value r1. Therefore, voltage dividing circuit 440 divides power supply voltage Vcc in accordance with a ratio between resistance values r2 and r1, and a divided voltage V3 thus produced is output from node 422 to comparator 425. A relationship of r2<r3<r1 is present among resistance values r1, r2 and r3. Therefore a relationship of V1<V2<V3 is present among voltages V1, V2 and V3.

Comparator 423 receives voltage V1 sent from voltage dividing circuit 420 on its positive terminal, and receives constant voltage V0 sent from constant voltage supply 426 on its negative terminal. Comparator 423 compares voltage V1 with constant voltage V0, and outputs signal Vc3 having a logical level corresponding to a result of the comparison to signal generating circuit 410.

Comparator 424 receives voltage V2 supplied from voltage dividing circuit 430 on its positive terminal, and receives constant voltage V0 supplied from constant voltage supply 426 on its negative terminal. Comparator 424 compares voltage V2 with constant voltage V0, and outputs signal Vc2 having a logical level corresponding to a result of the comparison to signal generating circuit 410.

Comparator 425 receives voltage V3 from voltage dividing circuit 440 on its positive terminal, and receives constant voltage V0 from constant voltage supply 426 on its negative terminal. Comparator 425 compares voltage V3 with constant voltage V0, and outputs signal Vc1 having a logical level corresponding to a result of the comparison to signal generating circuit 410. Constant voltage supply 426 supplies constant voltage V0 to comparators 423–425.

For examples, resistance value r1 of each of resistances 412 and 421 is equal to 4 kΩ, resistance value r2 of each of resistances 413 and 419 is equal to 3 kΩ, resistance value r3 of each of resistances 416 and 417 is equal to 3.5 kΩ, constant voltage V0 is equal to 2.0 V, and power supply voltage selectively changes to 3.0 V, 3.5 V, 4.0 V and 5.0 V. In this case, the logical levels of signals Vc1, Vc2, Vc3, T1 and T2 change as shown in the following table 1.

TABLE 1

| Vcc | Vc1 | Vc2 | Vc3 | T1 | T2 |
|-----|-----|-----|-----|----|----|
| 3.0 | L | L | L | L | L |
| 3.5 | H | L | L | L | H |
| 4.0 | H | H | L | H | H |
| 5.0 | H | H | H | L | L |

As a result, test mode circuit 280D outputs signals T1 and T2 having the logical levels, of which combination can exhibit three different patterns or results. The combination of the logical levels of signals T1 and T2 represents the test contents of DRAMs 11D–28D. For example, when the combination of the logical levels of signals T1 and T2 exhibits [L, L], a test (1) is executed with contents "test is executed with various voltage levels of the ground". When the combination of the logical levels of signals T1 and T2 exhibits [L, H], a test (2) is executed with contents "test is executed with the voltage levels of internal power supply voltages such as array operation voltage Vdds, precharge voltage Vb1, cell plate voltage Vcp changed to tighten input/output of the data". When the combination of the logical levels of signals T1 and T2 exhibits [H, H], a test (3) is executed with contents "test is executed with voltage Vpp, which is applied to a gate circuit for selectively connecting the bit line pairs to the global I/O line pair, at a lowered voltage level.

In the fifth embodiment, therefore, the voltage level is changed in a range of 3.0–4.0 V (or 3.5–5.0 V), and power supply voltage Vcc is supplied to DRAMs 11D–28D so that the tests of different contents are executed.

In DRAMs 11D–28D, signals T1 and T2 determining the test contents are generated by the following operation. The operation of supplying signals MRS and power supply voltage Vcc to DRAMs 11D–28D are the same as those in the first embodiment.

Assuming that power supply voltage Vcc of 3.0 V is supplied to DRAMs 11D–28D, Vcc detecting unit 400 in test mode circuit 280D outputs signals Vc1, Vc2 and Vc3 of L level to signal generating circuit 410 based on voltages V1, V2 and V3 produced by dividing power supply voltage Vcc of 3.0 V by three voltage dividing circuits 420, 430 and 440, respectively.

Thereby, NOR gate 401 in signal generating circuit 410 outputs a signal of L level to NOR gates 402 and 403 based on signal Vc3 of L level, chip select signal CS of L level, row address strobe signal RAS of L level, column address strobe signal CAS of L level and write enable signal WE of L level. NOR gate 402 outputs a signal of L level to NOR gate 404 based on the signal of L level sent from NOR gate 401, signal Vc1 of L level, chip select signal CS of L level, row address strobe signal RAS of L level, column address strobe signal CAS of L level and write enable signal WE of L level. NOR gate 404 outputs a signal of H level based on the signal of L level, and inverter 405 outputs signal T2 of L level.

NOR gate 403 outputs a signal of L level to NOR gate 406 based on a signal of L level sent from NOR gate 401, chip select signal CS of L level, row address strobe signal RAS of L level, column address strobe signal CAS of L level and write enable signal WE of L level. NOR gate 406 outputs a signal of H level to inverter 407 based on the signal of L level, and inverter 407 outputs signal T1 of L level. Control circuit 391 receives signals T1 and T2 of [L, L], and executes the foregoing test (1).

When power supply voltage Vcc having another voltage level is supplied to DRAMs 11D–28D, test mode circuit 280D performs operations similar to those already described, and outputs signals T1 and T2 having the logical levels corresponding to the voltage level of power supply voltage Vcc to control circuit 391. Control circuit 391 executes the test (2) or (3) described before.

The operations of inputting and outputting the data to and from the plurality of memory cells included in memory cell array 320 are well known, and therefore are not described.

According to the fifth embodiment, the DRAM includes the test mode circuit, which generates the signal designating the test contents in accordance with the voltage levels of the power supply voltage supplied thereto. Therefore, the test can be conducted on the DRAM assembled in the semiconductor module without employing a determining circuit, which determines test contents based on the address signal.

[Sixth Embodiment]

Figure 25:
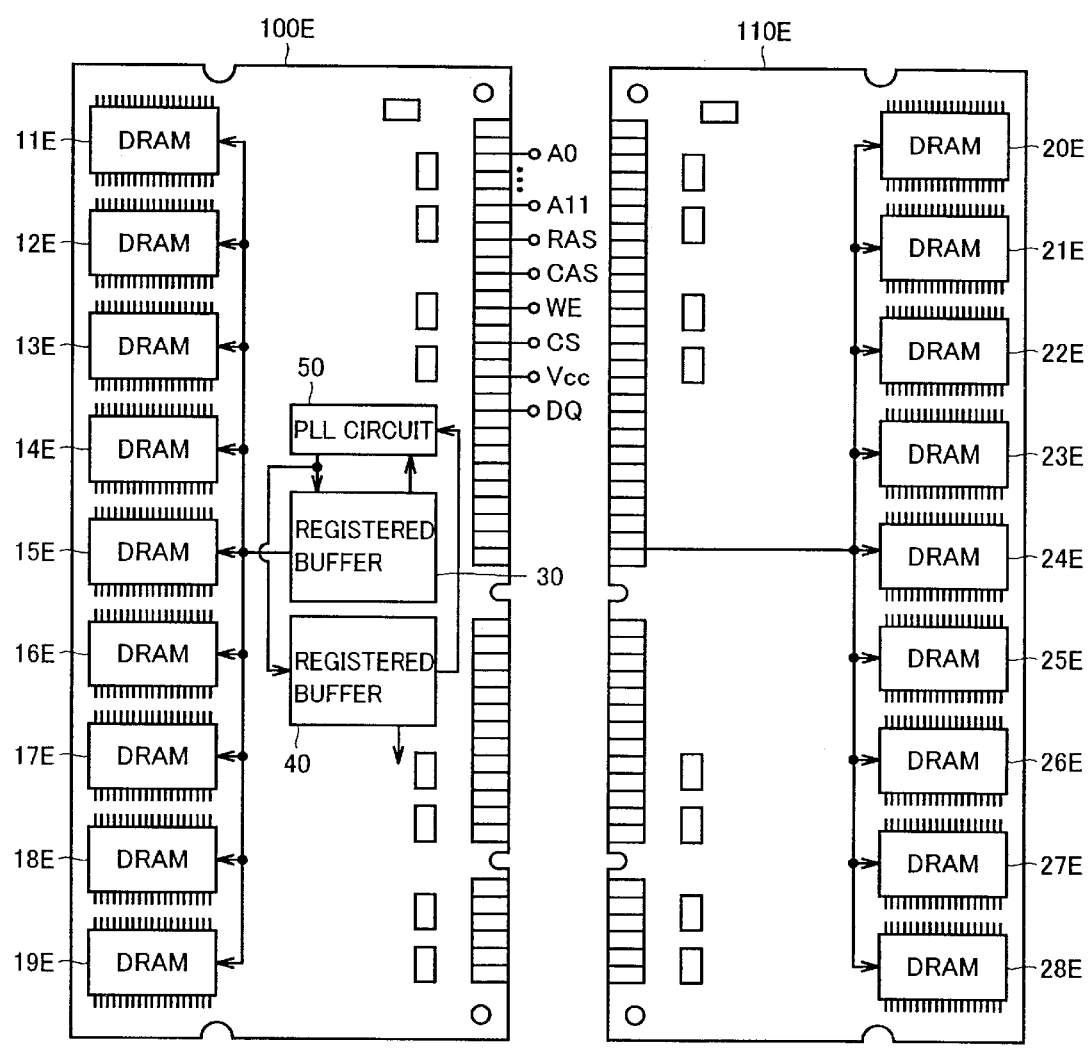
FIG. 25 is a schematic block diagram of a semiconductor module according to a sixth embodiment.

Referring to FIG. 25, a semiconductor module 100E of a sixth embodiment differs from semiconductor module 100 in that DRAMs 11E–19E are employed instead of DRAMs 11–19. Other structures are the same as those of semiconductor module 100. A semiconductor module 110E of the sixth embodiment differs from semiconductor module 110 in that DRAMs 20E–28E are employed instead of DRAMs 20–28, and other structures are the same as those of semiconductor module 110.

Figure 26:
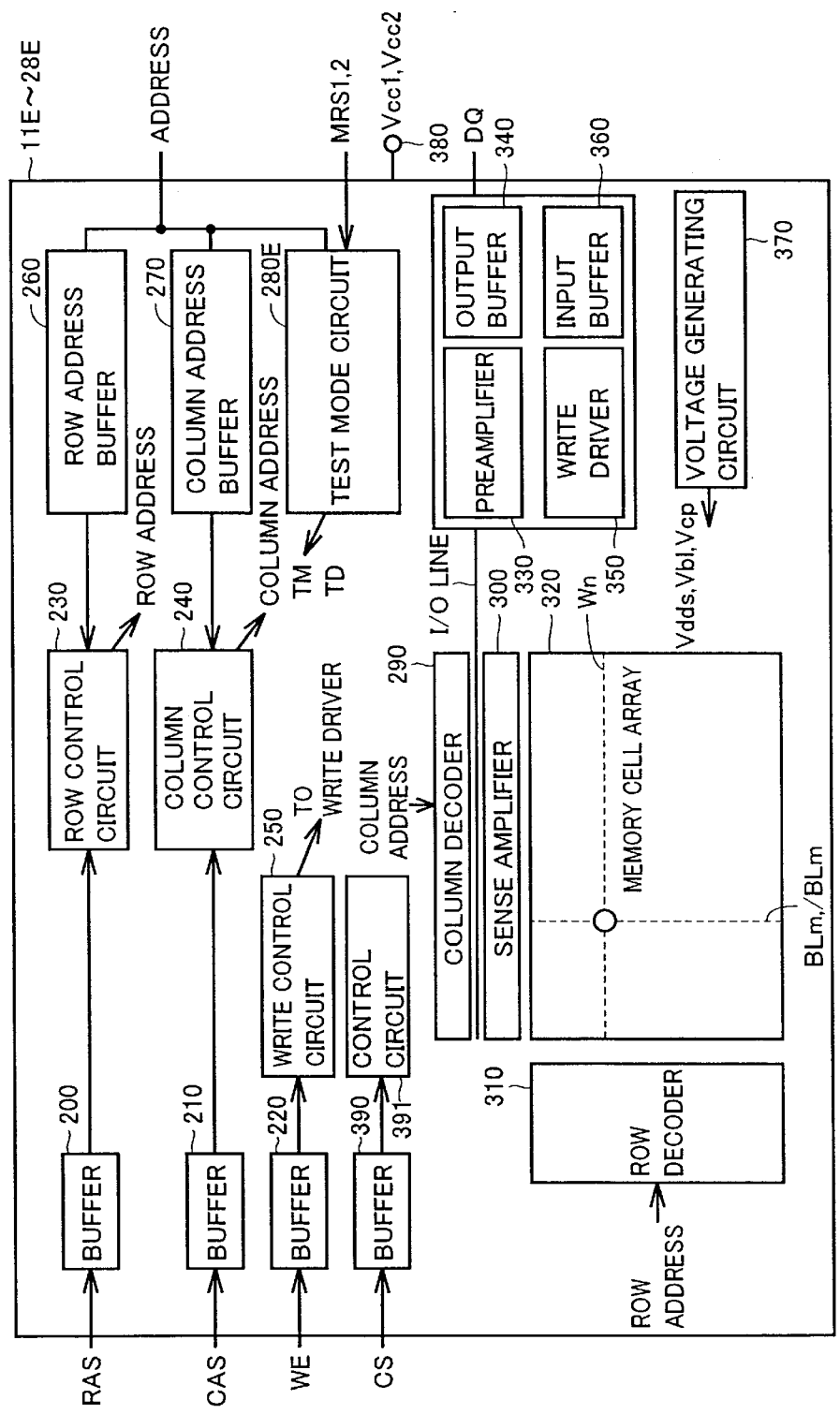
FIG. 26 is a schematic block diagram of a DRAM shown in FIG. 25.

Referring to FIG. 26, DRAMs 11E–28E differ from DRAMs 11–28 in that test mode circuits 280E are employed instead of test mode circuits 280, respectively. Other structures are the same as those of DRAMs 11–28.

Figure 27:
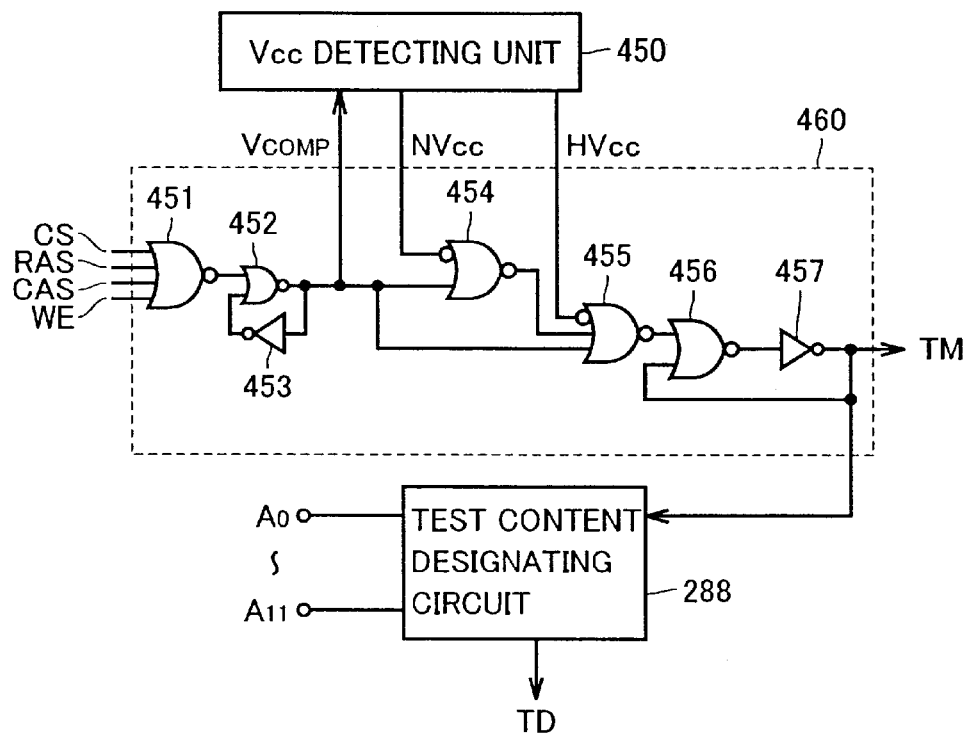
FIG. 27 is a circuit block diagram of a test mode circuit shown in FIG. 26.

Referring to FIG. 27, test mode circuit 280E includes a Vcc detecting unit 450 instead of Vcc detecting unit 281 of test mode circuit 280, and includes a signal generating circuit 460 instead of signal generating circuit 279. Other structures are the same as those of test mode circuit 280. Vcc detecting unit 450 outputs logic signals HVcc and NVcc to signal generating circuit 460 only when a signal VCOMP of L level is input thereto, as will be described later.

Signal generating circuit 460 includes NOR gates 451, 452 and 454–456 as well as inverters 453 and 457. NOR gate 451 performs a logical OR on chip select signal CS, row address strobe signal RAS, column address strobe signal CAS and write enable signal WE, and outputs a signal produced by inverting a result of this logical operation to NOR gate 452. NOR gate 452 performs a logical OR on the output signal of NOR gate 451 and the output signal of inverter 453, and outputs signal VCOMP produced by inverting a result of this logical operation to Vcc detecting unit 450 and NOR gates 454 and 455. Inverter 453 inverts the output signal of NOR gate 452, and outputs the inverted signal to NOR gate 452. NOR gate 452 and inverter 453 form a latch circuit.

NOR gate 454 performs a logical OR on the output signal of NOR gate 452 and an inverted signal of logic signal NVcc, and outputs a signal produced by inverting a result of this logical operation to NOR gate 455. NOR gate 455 performs a logical OR on the output signals of NOR gates 452 and 454, and an inverted signal of logic signal HVcc, and outputs a signal produced by inverting a result of the logical operation to NOR gate 456. NOR gate 456 performs a logical OR on the output signals of NOR gate 455 and inverter 457, and outputs a signal produced by inverting a result of this logical operation to inverter 457. Inverter 457 inverts the output signal of NOR gate 456, and outputs the inverted signal as test mode signal TM to NOR gate 456, test content designating circuit 288 and control circuit 391.

Figure 28:
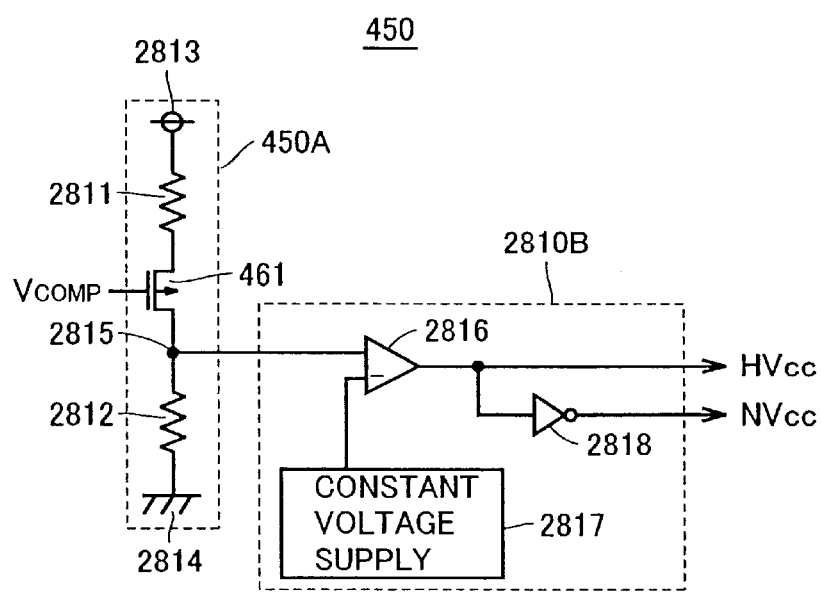
FIG. 28 is a circuit diagram of a Vcc detecting unit shown in FIG. 27.

Referring to FIG. 28, Vcc detecting unit 450 differs from Vcc detecting unit 281 in that a voltage dividing circuit 450A is employed instead of voltage dividing circuit 2810A. Other structures are the same as those of Vcc detecting unit 281. Voltage dividing circuit 450A corresponds to a structure, in which a P-channel MOS transistor 461 is added to voltage dividing circuit 2810A and is interposed between resistance 2811 and node 2815. Other structures are the same as voltage dividing circuit 2810A. P-channel MOS transistor 461 receives signal VCOMP sent from signal generating circuit 460 on its gate terminal. Therefore, voltage dividing circuit 450A is activated only when it receives signal VCOMP of L level. Voltage dividing circuit 450A thus activated divides each of power supply voltages Vcc1 and Vcc2 supplied from power supply node 2813 to produce half the original voltage, and outputs the divided voltage from node 2815 to comparator 2816. As a result, Vcc detecting unit 450 issues logic signal HVcc and NVcc to signal generating circuit 460 when it receives signal VCOMP of L level from signal generating circuit 460. Signal VCOMP attains L level when chip select signal CS, row address strobe signal RAS, column address strobe signal CAS and write enable signal WE have L level, and therefore DRAMs 11E–28E are to be shifted to the test mode. Thus, Vcc detecting unit 450 generates logic signals HVcc and NVcc only when DRAMs 11E–28E are to be shifted to the test mode.

As a result, it is possible to prevent flowing of current from power supply node 2813 to ground node 2814 in voltage dividing circuit 450A during the normal operation so that a power consumption can be small.

Description will now be given on the operations of shifting DRAMs 11E–28E to the test mode in semiconductor modules 100E and 10E. Operations of supplying signals MRS 1 and MRS2 as well as power supply voltages Vcc1 and Vcc2 to DRAMs 11E–28E are the same as those in the first embodiment.

When signals MRS1 and power supply voltage Vcc1 are supplied to DRAMs 11E–28E, signal generating circuit 460 in test mode circuit 280E operates as follows. NOR gate 451 outputs a signal of H level based on chip select signal CS of L level, row address strobe signal RAS of L level, column address strobe signal CAS of L level and write enable signal WE of L level. NOR gate 452 outputs signal VCOMP of L level to Vcc detecting unit 450 and NOR gates 454 and 455 based on the signal of H level.

Thereby, P-channel MOS transistor 461 in Vcc detecting unit 450 is turned on to activate voltage dividing circuit 450A. Vcc detecting unit 450 outputs logic signal HVcc of L level and logic signal NVcc of H level to signal generating circuit 460 by the same operation as that in the first embodiment already described.

In signal generating circuit 460, NOR gate 454 outputs a signal of H level to NOR gate 455 based on signal Vcomp of L level and logic signal NVcc of H level, and NOR gate 455 outputs a signal of L level to NOR gate 456 based on the signal of H level sent from NOR gate 454, logic signal HVcc of L level and signal VCOMP of L level. NOR gate 456 outputs a signal of H level to inverter 457 based on the signal of L level, and inverter 457 outputs test mode signal TM of L level to NOR gate 456, test content designating circuit 288 and control circuit 391.

When signals MRS2 and power supply voltage Vcc2 are supplied to DRAMs 11E–28E after the above operation, signal generating circuit 460 outputs signal VCOMP of L level to Vcc detecting unit 450, as already described. Voltage dividing circuit 450A in Vcc detecting unit 450 is activated in response to reception of signal VCOMP of L level, and Vcc detecting unit 450 outputs logic signal HVcc of H level and logic signal NVcc of L level to signal generating circuit 460 by the same operation as that in the first embodiment already described.

Thereby, NOR gate 454 in signal generating circuit 460 outputs a signal of L level to NOR gate 455 based on signal VCOMP of L level and logic signal NVcc of L level, and NOR gate 455 outputs a signal of H level to NOR gate 456 based on the signal of L level sent from NOR gate 454, logic signal HVcc of H level and signal VCOMP of L level. NOR gate 456 outputs a signal of L level to inverter 457 based on the signal of H level, and inverter 457 outputs test mode signal TM of H level to NOR gate 456, test content designating circuit 288 and control circuit 391.

Operations after the above are the same as those in the first embodiment.

In the sixth embodiment, signal generating circuit 2810C in Vcc detecting unit 281A (see FIG. 7) may be employed instead of signal generating circuit 2810B in Vcc detecting unit 450. In voltage dividing circuits 2901 and 2902 in Vcc detecting unit 289 (see FIG. 15), P-channel MOS transistor 461 may be interposed between power supply node 2890 and ground node 2893. In voltage dividing circuit 297 of Vcc detecting unit 2904 (see FIG. 19), P-channel MOS transistor 461 may be interposed between power supply node 293 and ground node 294. In voltage dividing circuits 420, 430 and 440 (see FIG. 24) in Vcc detecting unit 400, P-channel MOS transistor 461 may be interposed between power supply node 411 and ground node 414.

Structures and operations other than the above are the same as those of the first embodiment.

According to the sixth embodiment, the DRAM can enter the test mode in the semiconductor module, and the power consumption in the normal operation can be small.

[Seventh Embodiment]

Figure 29:
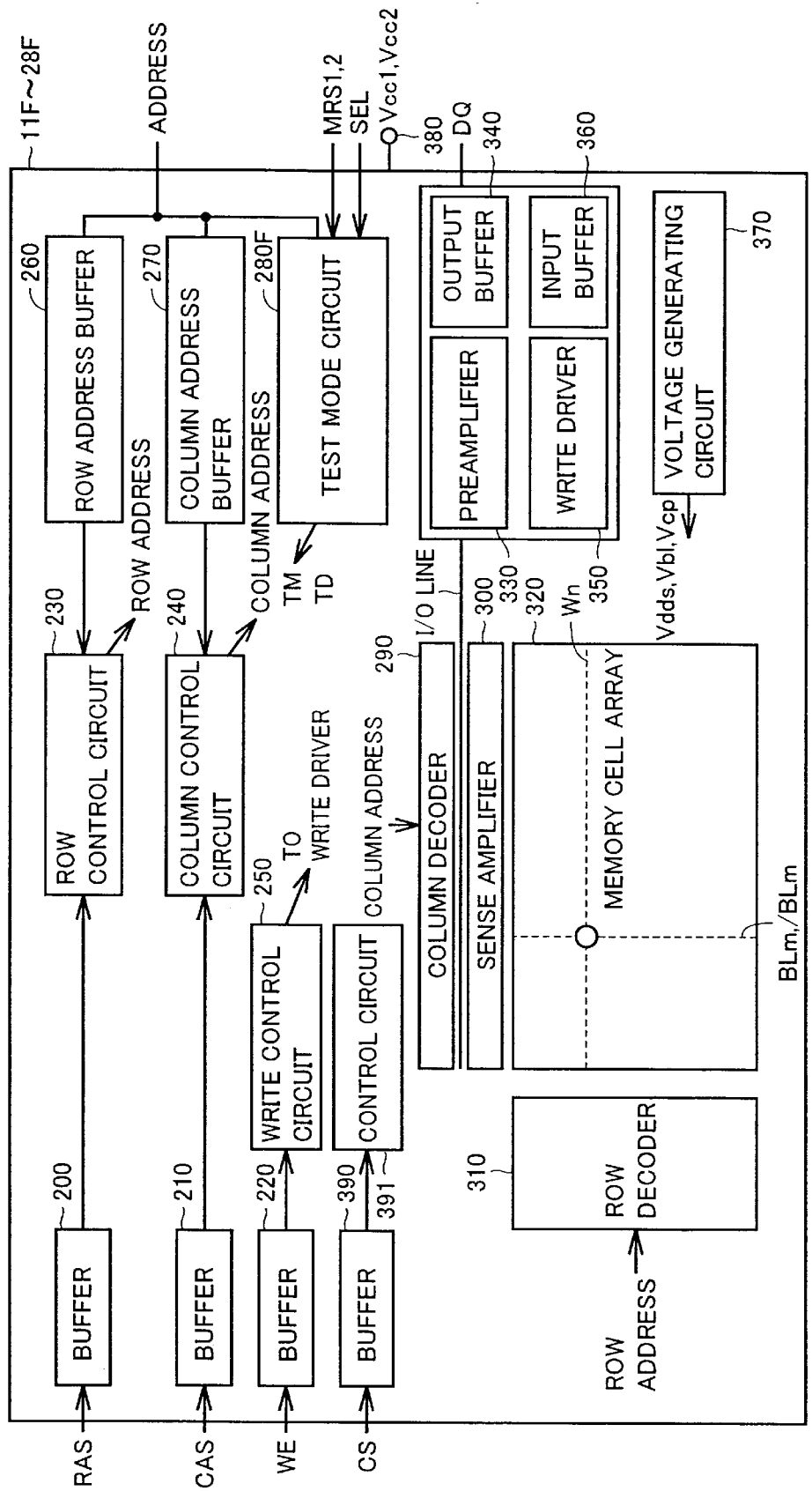
FIG. 29 is a schematic block diagram of a DRAM according to a seventh embodiment.

Referring to FIG. 29, DRAMs 11F–28F in a seventh embodiment differ from DRAMs 11–28 in that test mode circuits 280F are employed instead of test mode circuits 280, respectively. Other structures are the same as those of DRAMs 11–28. However, test mode circuit 280F receives a select signal SEL in addition to signals MRS1 and MRS2.

Figure 30:
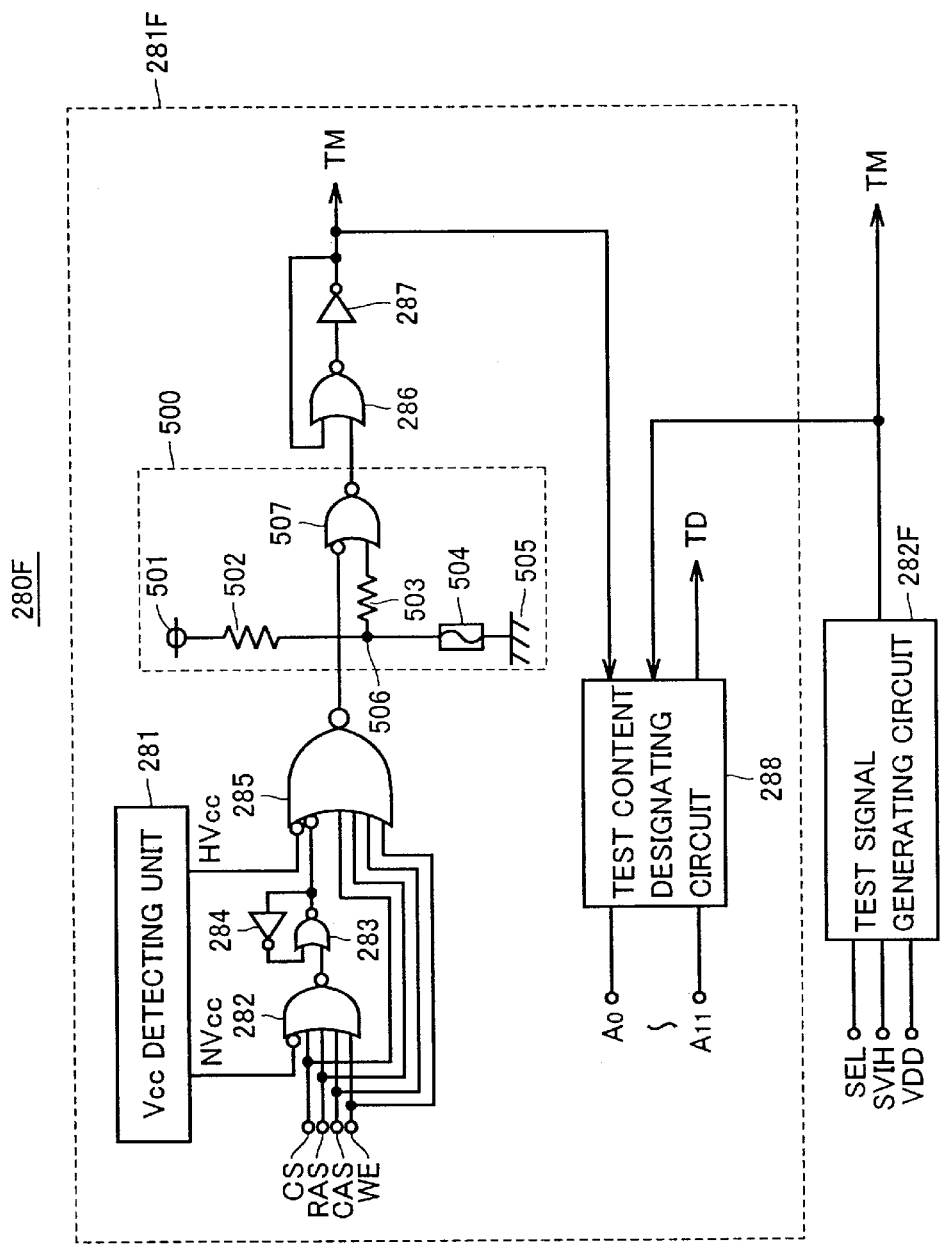
FIG. 30 is a circuit block diagram of a test mode circuit shown in FIG. 29.

Referring to FIG. 30, test mode circuit 280F is formed of test signal generating circuits 281F and 282F. Test signal generating circuit 281F includes Vcc detecting unit 281, NOR gates 282, 283, 285 and 286, inverters 284 and 287, an activating circuit 500 and test content designating circuit 288. Test signal generating circuit 281F has the same structure as signal generating circuit 279 of test mode circuit 280 except for that activating circuit 500 is additionally arranged. In test signal generating circuit 281F, Vcc detecting unit 281, NOR gates 282, 283, 285 and 286, inverters 284 and 287, and test content designating circuit 288 are the same as those in the first embodiment already described.

Activating circuit 500 includes resistances 502 and 503, a fuse 504 and an NOR gate 507. Resistance 502 and fuse 504 are connected in series between a power supply node 501 and a ground node 505. Resistance 503 is connected between a node 506 and NOR gate 507. NOR gate 507 performs a logical OR on an inverted signal of the output signal of NOR gate 285 and a signal formed of a voltage on node 506, and outputs a signal produced by inverting a result of this logical operation to NOR gate 286.

When fuse 504 is not open, NOR gate 507 receives a signal formed of the ground voltage, i.e., a signal of L level from node 506 so that NOR gate 507 outputs a signal at the logical level depending on the logical level of the output signal of NOR gate 285 to NOR gate 286.

When fuse 504 is open, NOR gate 507 receives a signal formed of power supply voltage Vcc1 or Vcc2, i.e., a signal of H level on its node 506, and therefore outputs a signal of L level regardless of the logical level of the output signal of NOR gate 285. When fuse 504 is open, therefore, test signal generating circuit 281F always outputs test mode signal TM of L level so that the device is inoperable.

Test signal generating circuit 282F generates test mode signal TM based on select signal SEL, a signal SVIH formed of a voltage with a higher level than that in the normal operation and a reference voltage VDD in a manner, which will be described later. Test signal generating circuit 282F outputs test mode signal TM to test content designating circuit 288 and control circuit 391. Select signal SEL is formed of select signals SEL1–SEL3.

Figure 31:
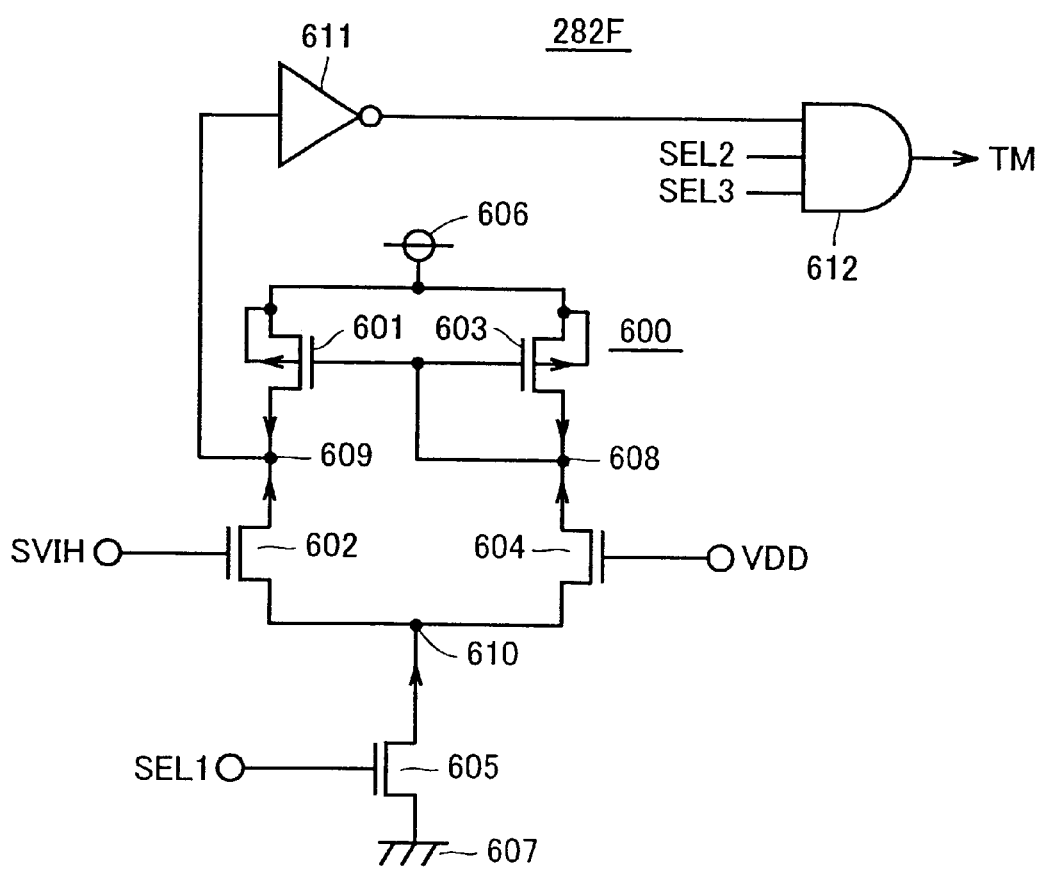
FIG. 31 is a circuit diagram of a test signal generating circuit shown in FIG. 30.

Referring to FIG. 31, test signal generating circuit 282F includes P-channel MOS transistors 601 and 603, N-channel MOS transistors 602, 604 and 605, an inverter 611 and an AND gate 612.

P-channel MOS transistor 601 and N-channel MOS transistor 602 are connected in series between a power supply node 606 and a node 610. P-channel MOS transistor 603 and N-channel MOS transistor 604 are connected in series between power supply node 606 and node 610. P-channel MOS transistor 601 and N-channel MOS transistor 602 are connected in parallel to P-channel MOS transistor 603 and N-channel MOS transistor 604. Each of P-channel MOS transistors 601 and 603 receives on its gate terminal a voltage on node 608. N-channel MOS transistor 602 receives signal SVIH on its gate terminal. N-channel MOS transistor 604 receives reference voltage VDD on its gate terminal. N-channel MOS transistor 605 is connected between node 610 and ground node 607, and receives select signal SEL1 on its gate terminal.

P-channel MOS transistors 601 and 603 as well as N-channel MOS transistors 602, 604 and 605 form a differential comparing circuit 600 of a current mirror type. Differential comparing circuit 600 compares the voltage level of signal SVIH with the voltage level of reference voltage VDD, and outputs a signal, which has a logical level corresponding to a result of the comparison, from node 609 to inverter 611.

When signal SVIH is higher in voltage level than reference voltage VDD, the voltage on node 609 is lower than the voltage on node 608 so that differential comparing circuit 600 outputs a signal of L level to inverter 611. When signal SVIH is lower in voltage level than reference voltage VDD, the voltage on node 609 is higher than the voltage on node 608 so that differential comparing circuit 600 outputs a signal of H level to inverter 611.

Inverter 611 receives a signal of H level or L level from node 609 of differential comparing circuit 600, and inverts the received signal for outputting it to AND gate 612. AND gate 612 performs a logical AND on the signal sent from inverter 611 and select signals SEL2 and SEL3, and outputs a result of the operation as test mode signal TM to test content designating circuit 288 and control circuit 391.

When DRAMs 11F–28F mounted on registered DIMM are to be shifted to the test mode, test mode circuit 280F receives power supply voltages Vcc1 and Vcc2, signals MRS1 and MRS2, and select signals SEL (SEL1–SEL3) of L level, and fuse 504 of test signal generating circuit 281F is not blown off.

Thereby, differential comparing circuit 600 of test signal generating circuit 282F receives select signal SEL1 of L level, and is deactivated. In activating circuit 500 of test signal generating circuit 281F, NOR gate 507 receives a signal of L level from node 506 so that test signal generating circuit 281F detects the voltage levels of power supply voltages Vcc1 and Vcc2 based on signals MRS1 and MRS2, and thereby generates test mode signal TM.

When DRAMs 11F–28F mounted on the DIMM (not provided with a registered buffer) are to be shifted to the test mode, test mode circuit 280F receives signal SVIH formed of a voltage with a higher voltage level than that in the normal operation, reference voltage VDD and select signals SEL (SEL1–SEL3) of H level, and fuse 504 in test signal generating circuit 281F is blown off.

Thereby, NOR gate 507 in activating circuit 500 of test signal generating circuit 281F receives a signal of H level from node 506 so that test signal generating circuit 281F is deactivated as described above. Differential comparing circuit 600 in test signal generating circuit 282F receives select signal SEL1 of H level, and thereby is activated. Test signal generating circuit 282F compares the voltage level of signal SVIH with reference voltage VDD, and generates test mode signal TM.

Figure 32:
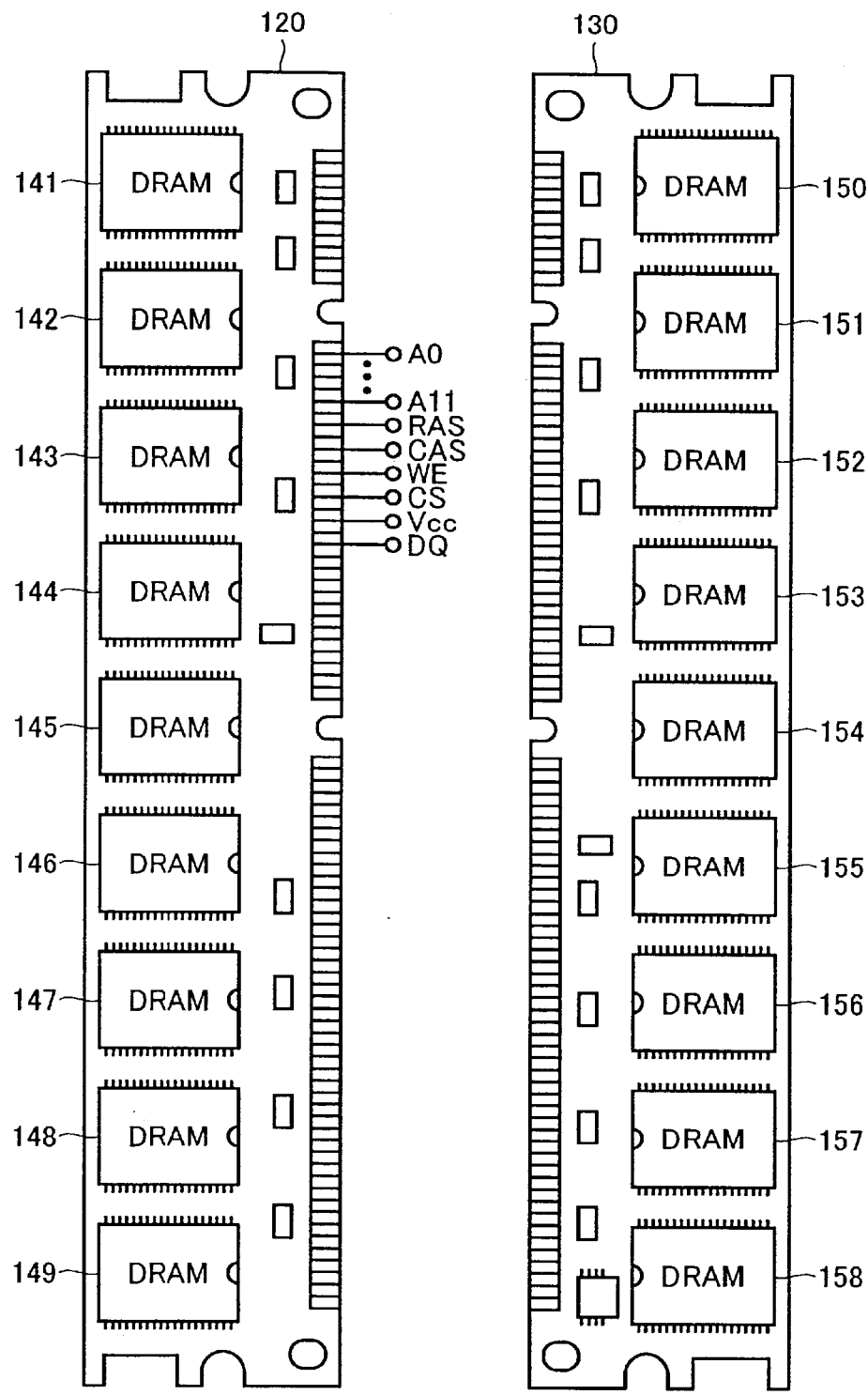
FIG. 32 is a schematic block diagram of a DIMM without a registered buffer circuit.
Figure 33:
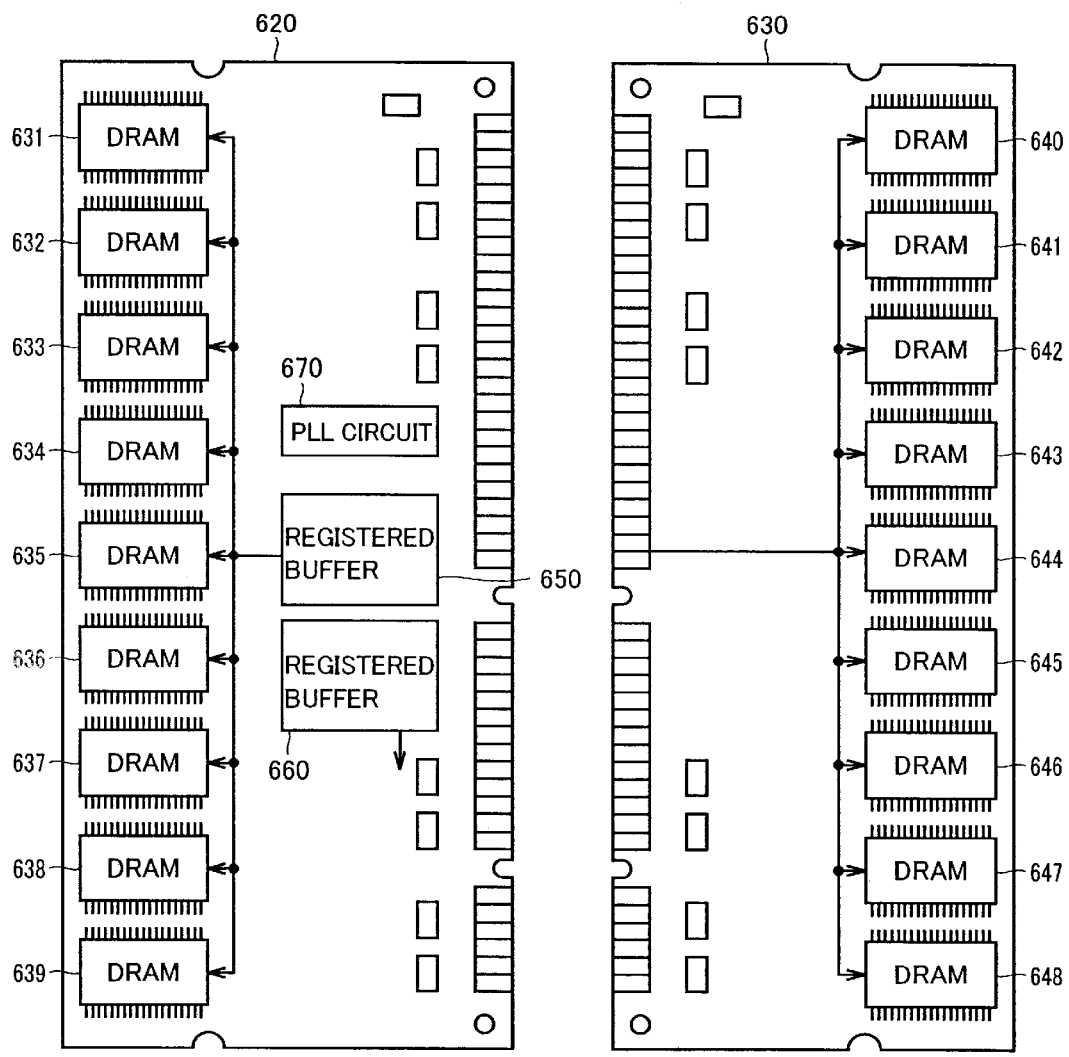
FIG. 33 is a schematic block diagram of a registered DIMM in the prior art.
Figure 34:
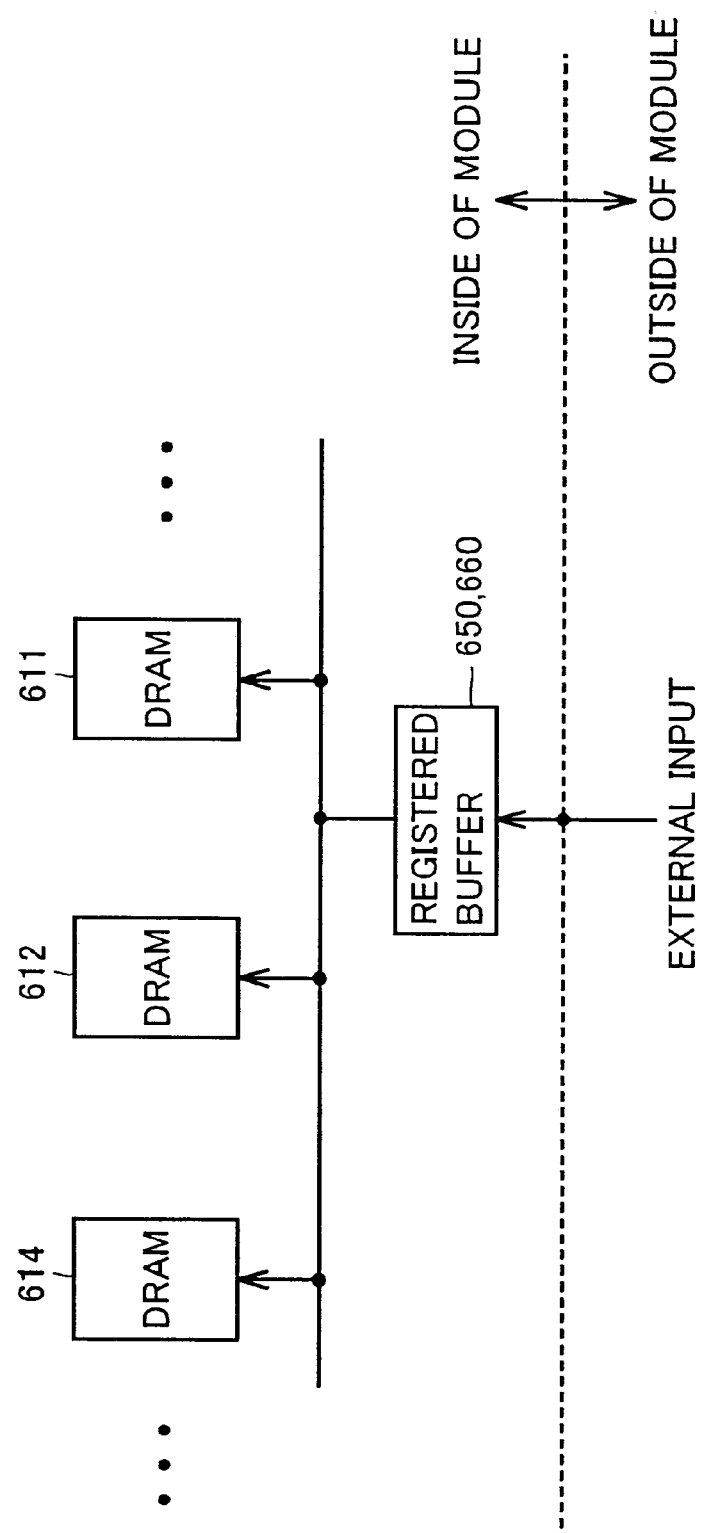
FIG. 34 shows a function of a registered buffer arranged in the registered DIMM shown in FIG. 33.
Figure 35:
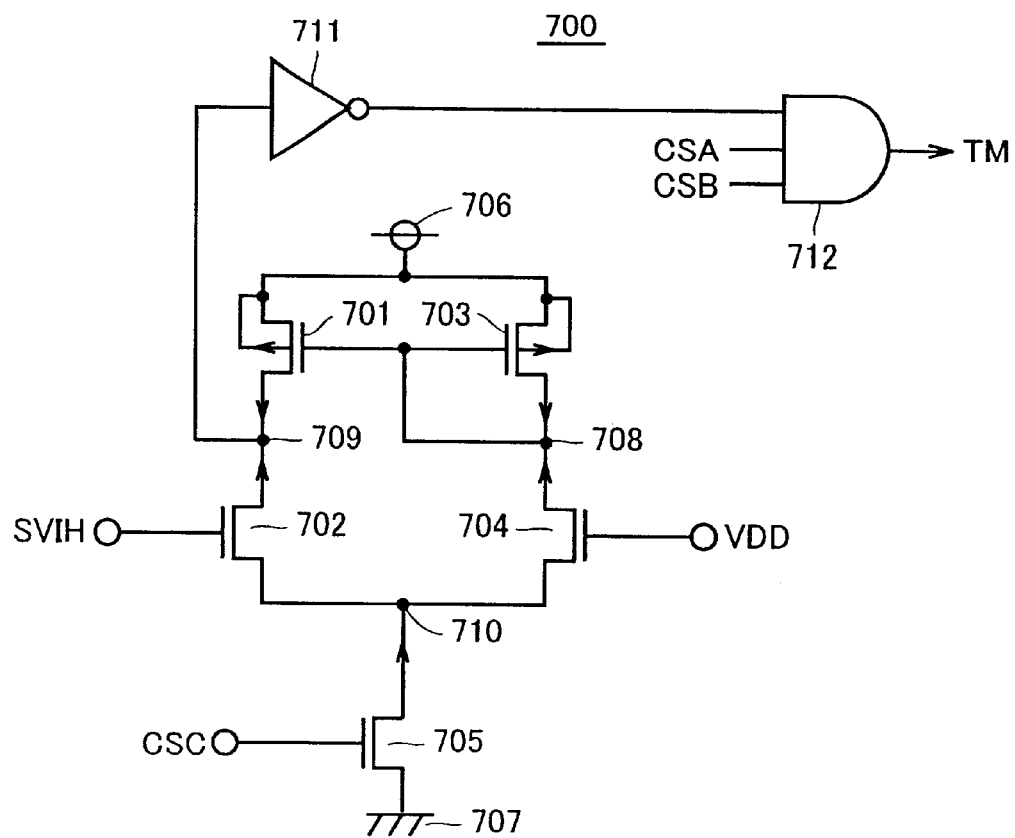
FIG. 35 is a circuit diagram of a test mode circuit in the prior art.

Referring to FIG. 32, a semiconductor module 120 formed of a DIMM includes DRAMs 141–149, and a semiconductor module 130 formed of a DIMM includes DRAMs 150–158. Semiconductor module 120 externally receives address signals A0–A11, row address strobe signal RAS, column address strobe signal CAS, write enable signal WE, chip select signal CS and data. Received address signals A0–A11 and others are applied to DRAMs 141–149 and DRAMs 150–158 of semiconductor module 130. As described above, semiconductor modules 120 and 130 are not provided with a registered buffer so that signals formed of voltages with a higher voltage level than that in the normal operation can be externally supplied to DRAMs 141–158 in semiconductor modules 120 and 130.

In semiconductor modules 120 and 130 equipped with DRAMs 11F–28F, DRAMs 11F–28F are used instead of DRAMs 141–158.

Operations of shifting DRAMs 11F–28F to the test mode will now be described. First, description will be given on the operation of shifting DRAMs 11F–28F mounted on registered DIMM to the test mode. In this case, test mode circuit 280F is supplied with power supply voltages Vcc1 and Vcc2, and also receives signals MRS1 and MRS2 as well as select signals SEL (SEL1–SEL3) of L level from registered buffer 30 or 40 so that fuse 504 in test signal generating circuit 281F is not blown off.

Thereby, differential comparing circuit 600 in test signal generating circuit 282F receives select signal SEL1 of L level, and is deactivated. In activating circuit 500 of test signal generating circuit 281F, NOR gate 507 receives a signal of L level from node 506.

When power supply voltage Vcc1 and signals MRS1 are supplied, Vcc detecting unit 281 of test signal generating circuit 281F detects power supply voltage Vcc1, as already described in connection with the first embodiment, and outputs logic signal HVcc of L level and logic signal NVcc of H level. NOR gate 282 outputs a signal of H level to NOR gate 283 based on logic signal NVcc of H level, chip select signal CS of L level, row address strobe signal RAS of L level, column address strobe signal CAS of L level and write enable signal WE of L level. NOR gate 283 and inverter 284 output a latched signal of L level to NOR gate 285 based on the signal of H level, and NOR gate 285 outputs a signal of L level to NOR gate 507 based on logic signal HVcc of L level, a signal of L level sent from NOR gate 283, chip select signal CS of L level, row address strobe signal RAS of L level, column address strobe signal CAS of L level and write enable signal WE of L level.

NOR gate 507 outputs a signal of L level to NOR gate 286 based on the signal of L level sent from NOR gate 285 and the signal of L level sent from node 506. NOR gate 286 outputs a signal of H level to inverter 287, and inverter 287 outputs test mode signal TM of L level to test content designating circuit 288 and control circuit 391.

When power supply voltage Vcc2 and signals MRS2 are supplied thereafter, Vcc detecting unit 281 of test signal generating circuit 281F detects power supply voltage Vcc2, and outputs logic signal HVcc of H level and logic signal NVcc of L level, as already described in connection with the first embodiment. NOR gate 282 outputs a signal of L level to NOR gate 283 based on logic signal NVcc of L level, chip select signal CS of L level, row address strobe signal RAS of L level, column address strobe signal CAS of L level and write enable signal WE of L level. NOR gate 283 and inverter 284 outputs a latched signal of H level to NOR gate 285 based on the signal of L level. NOR gate 285 outputs a signal of H level to NOR gate 507 based on logic signal HVcc of H level, the signal of H level sent from NOR gate 283, chip select signal CS of L level, row address strobe signal RAS of L level, column address strobe signal CAS of L level and write enable signal WE of L level.

NOR gate 507 outputs a signal of H level to NOR gate 286 based on the signal of H level sent from NOR gate 285 and the signal of L level sent from node 506. NOR gate 286 outputs a signal of L level to inverter 287. Inverter 287 outputs test mode signal TM of H level to test content designating circuit 288 and control circuit 391. Thereafter, DRAMs 11F–28F operate in the same manner as that in the first embodiment already described.

In test mode circuit 280F in each of DRAMs 11F–28F mounted on the registered DIMM, as described above, test signal generating circuit 28 IF successively generates test mode signals TM at L- and H levels so that DRAMs 11F–28F are shifted to the test mode.

Description will now be given on the operations of shifting DRAMs 11F–28F, which are mounted on semiconductor modules 120 and 130 formed of the DIMMs shown in FIG. 32, to the test mode. In this case, test mode circuit 280F externally receives signal SVIH formed of a voltage with a higher voltage level than that in the normal operation as well as select signals SEL (SEL1–SEL3) of H level, and is supplied with reference voltage VDD so that fuse 504 of test signal generating circuit 281F is blown off.

Thereby, NOR gate 507 in activating circuit 500 of test signal generating circuit 281F receives a signal of H level from node 506 so that test signal generating circuit 281F is deactivated. Differential comparing circuit 600 in test signal generating circuit 282F receives select signal SEL1 of H level, and thereby becomes active.

Differential comparing circuit 600 compares the voltage level of signal SVIH with the voltage level of reference voltage VDD, and outputs a signal of L level to inverter 611. Inverter 611 inverts the signal of L level to output a signal of H level to AND gate 612. AND gate 612 performs a logical AND on the signal of H level sent from inverter 611 and select signals SEL2 and SEL3 of H level which are externally supplied, and outputs test mode signal TM of H level to test content designating circuit 288 and control circuit 391.

In DRAMs 11F–28F mounted on semiconductor modules 120 and 130, when test content designating circuit 288 receives test mode signal TM of H level from test signal generating circuit 282F, it determines the test contents based on the received address signals A0–A11, and outputs test content designating signal TD designating the determined test contents to control circuit 391. When control circuit 391 receives test mode signal TM of H level from test signal generating circuit 282F, it detects the fact that DRAMs 11F–28F are shifted to the test mode, and controls the peripheral circuits such as column decoder 290, which perform input/output of data, so as to execute the test contents designated by test content designating signal TD.

In DRAMs 11F–28F mounted on the DIMM, as described above, test mode circuit 280F operates to generate test mode signal TM of H level by test signal generating circuit 282F so that DRAMs 11F–28F are shifted to the test mode.

In the seventh embodiment, as described above, test signal generating circuit 281F is enabled by not blowing off fuse 504 if DRAMs 11F–28F are mounted on the registered DEIM. If DRAMs 11F–28F are mounted on the DIMM without a registered buffer, fuse 504 is blown off to disable test signal generating circuit 281F. This is because the structure without the registered buffer can operate to supply signal SVIH formed of a voltage with a higher voltage level than the power supply voltage in the normal operation, as can be done in the prior art, and thereby can shift DRAMs 11F–28F to the test mode.

Fuse 504 may be either of a resistance element, which can be programmed during processing of a wafer, or a program unit, which can be electrically cut off.

In the example already described, activating circuit 500 is arranged in test mode circuit 280. However, the invention is not restricted to this, and activating circuit 500 may be arranged in test mode circuits 280A, 280B, 280C, 280D and/or 280E.

Structures other than the above are the same as those of the first embodiment.

According to the seventh embodiment, since the DRAM includes the test signal generating circuit to be activated selectively, the DRAM can enter the test mode independently of the type of the semiconductor module, on which the DRAMs are mounted. If the DRAMs are mounted on the semiconductor module not provided with the registered buffer, the DRAM is shifted to the test mode by the signal, which is formed of the voltage with a higher voltage level than that in the normal operation. Therefore, a malfunction can be prevented when shifting the DRAM to the test mode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a power supply terminal for receiving a power supply voltage;
   a memory cell array including a plurality of memory cells;
   a peripheral circuit for inputting and outputting data to and from said plurality of memory cells; and
   a test mode circuit for operating, in an operation of shifting to a test mode, to detect a voltage level of a power supply voltage supplied from said power supply terminal in response to external input of a test mode shift signal, and generate a test mode signal for testing a special operation when the detected voltage level is different from the voltage level in a normal operation, wherein
   said peripheral circuit performs input and output of data used for testing said special operation of each of said plurality of memory cells in response to said test mode signal.

2. The semiconductor memory device according to claim 1, wherein
   said test mode shift signal is formed of first and second test mode shift signals,
   said power supply voltage is formed of first and second power supply voltages,
   said test mode circuit detects the voltage level of said first power supply voltage in response to said first test mode shift signal, detects the voltage level of said second power supply voltage in response to said second test mode shift signal, and generates said test mode signal when the detected voltage level of said second power supply voltage is different from the detected voltage level of said first power supply voltage.

3. The semiconductor memory device according to claim 2, wherein
   said test mode circuit generates said test mode signal when the detected voltage level of said second power supply voltage is higher than the detected voltage level of said first power supply voltage.

4. The semiconductor memory device according to claim 3, wherein
   said first power supply voltage is a power supply voltage supplied in the normal operation.

5. The semiconductor memory device according to claim 4, wherein
   said test mode circuit includes:
   a level detecting circuit for detecting the voltage level of said first or second power supply voltage, and outputting a first level signal indicative of the detected voltage level of said first power supply voltage and a second level signal indicative of the detected voltage level of said second power supply voltage, and
   a signal generating circuit for generating a first detection signal based on said first level signal and said first test mode shift signal, generating, based on said second level signal and said second test mode shift signal, a second detection signal indicating that the detected voltage level of said second power supply voltage is higher than the detected voltage level of said first power supply voltage, and outputting said generated first and second detection signals as said test mode signals.

6. The semiconductor memory device according to claim 5, wherein
   said level detecting circuit is formed of:
   a voltage dividing circuit for dividing said first or second power supply voltage to generate a first or second divided voltage, and
   a comparing circuit for comparing the voltage level of said first or second divided voltage with a reference voltage level to output said first or second level signal.

7. The semiconductor memory device according to claim 5, wherein
   said level detecting circuit is formed of:
   a voltage dividing circuit for dividing said first or second power supply voltage to generate a first or second divided voltage, and
   a comparing circuit for comparing the voltage level of said first or second divided voltage with a first reference voltage level to output a first comparison result signal, comparing the voltage level of said first or second divided voltage with a second reference voltage level higher than said first reference voltage level to generate a second comparison result signal, and outputting said first or second level signal based on said generated first and second comparison result signals.

8. The semiconductor memory device according to claim 6, wherein
   said voltage dividing circuit is activated only in an operation of shifting to the test mode.

9. The semiconductor memory device according to claim 5, wherein
   said test mode circuit further includes:
   an activating circuit for selectively activating and deactivating said signal generating circuit in response to a type of a semiconductor module equipped said semiconductor memory device.

10. The semiconductor memory device according to claim 9, wherein
   said activating circuit is formed of:
   a power supply node,
   an output node,
   a resistance element connected between said power supply node and said output node, and
   a fuse connected between said output node and said ground node.

11. The semiconductor memory device according to claim 3, wherein
said first power supply voltage is lower in voltage level than a standard power supply voltage supplied in the normal operation, and
said second power supply voltage is higher in voltage level than said standard power supply voltage.

12. The semiconductor memory device according to claim 2, wherein
said test mode circuit generates said test mode signal when the detected voltage level of said second power supply voltage is lower than the detected voltage level of said first power supply voltage.

13. The semiconductor memory device according to claim 12, wherein
said second power supply voltage is a power supply voltage supplied in the normal operation.

14. The semiconductor memory device according to claim 1, wherein
said power supply terminal is formed of:
a first power supply terminal for receiving a first power supply voltage used in the normal operation, and a second power supply terminal for receiving a second power supply voltage, and
said test mode circuit generates said test mode signal when detecting in response to the input of said test mode shift signal that the voltage level of said second power supply voltage is higher than the voltage level of said first power supply voltage.

15. The semiconductor memory device according to claim 14, wherein
said test mode circuit includes:
a comparing circuit for comparing a voltage level of a divided voltage produced by dividing said second power supply voltage with the voltage level of said first power supply voltage, and outputting a comparison result, and
a signal generating circuit for generating said test mode signal in response to said test mode shift signal when said comparison result indicates that the voltage level of said divided voltage is higher than the voltage level of said first power supply voltage.

16. A semiconductor memory device comprising:
a power supply terminal for receiving a power supply voltage;
a memory cell array including a plurality of memory cells;
a peripheral circuit for inputting and outputting data to and from each of said plurality of memory cells; and
a test mode circuit for operating, in an operation of shifting to a test mode, to produce a plurality of logic signals based on said power supply voltage, and to output said plurality of produced logic signals as test signals indicating contents of the test for said memory cell, wherein
said peripheral circuit performs input and output of data used for executing the test corresponding to a logical pattern of said plurality of logic signals.

17. The semiconductor memory device according to claim 16, wherein
said test mode circuit includes:
a level detecting circuit for dividing said power supply voltage to a plurality of divided voltages having different voltage levels, respectively, and comparing said plurality of divided voltages with a reference voltage level to generate a plurality of level signals indicating the voltage levels of said plurality of divided voltages, and
a signal generating circuit for generating said plurality of logic signals based on an externally applied test mode shift signal and said plurality of level signals.

18. The semiconductor memory device according to claim 17, wherein
said level detecting circuit includes:
a voltage dividing circuit for dividing said power supply voltage to said plurality of divided voltages, and
a comparing circuit for comparing said plurality of divided voltages with said reference voltage level to generate said plurality of level signals.

19. A semiconductor module comprising:
a PLL circuit for generating a clock signal formed of a predetermined frequency;
a registered buffer circuit for converting an externally supplied input signal to an input signal formed of a voltage level for internal use, and outputting the converted input signal in synchronization with the clock signal;
a power supply terminal for receiving a power supply voltage; and
a plurality of semiconductor memory devices for receiving said input signal from said registered buffer circuit and operating in synchronization with said clock signal, wherein
each of said plurality of semiconductor memory devices includes:
a memory cell array including a plurality of memory cells,
a peripheral circuit inputting/outputting of data to and from each of said plurality of memory cells, and
a test mode circuit detecting, in an operation of shifting to a test mode, the voltage level of the power supply voltage supplied from said power supply terminal in response to input of a test mode shift signal from said registered buffer circuit, and generating a test mode signal for testing a special operation based on the detected voltage level; and
said peripheral circuit performs input/output of data used for testing said special operation to and from each of said plurality of memory cells in response to said test mode signal.

20. The semiconductor module according to claim 19, wherein said test mode circuit produces a plurality of logic signals having logical levels corresponding to said detected voltage level, and outputs the plurality of produced logic signals as test signals indicating contents of the test of said memory cells, and
said peripheral circuit performs input and output of data used for executing the test corresponding to a logical pattern of said plurality of logic signals.

* * * * *

UNITED STATES PATENT AND TRADEMARK OFFICE
CERTIFICATE OF CORRECTION

PATENT NO. : 6,646,936 B2
DATED : November 11, 2003
INVENTOR(S) : Akihito Hamamatsu et al.

It is certified that error appears in the above-identified patent and that said Letters Patent is hereby corrected as shown below:

<u>Title page,</u>
Item [73], Assignee, change "Mitsubishi Denki Kabushiki Kaisha" to
-- Renesas Technology Corp. --

Signed and Sealed this

Thirtieth Day of December, 2003

JAMES E. ROGAN
*Director of the United States Patent and Trademark Office*